(12) United States Patent
Shibukawa et al.

(10) Patent No.: US 8,316,497 B2
(45) Date of Patent: Nov. 27, 2012

(54) SUBSTRATE PROCESSING APPARATUS

(75) Inventors: Jun Shibukawa, Kyoto (JP); Shinji Kiyokawa, Kyoto (JP); Ichiro Mitsuyoshi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 958 days.

(21) Appl. No.: 12/359,756

(22) Filed: Jan. 26, 2009

(65) Prior Publication Data

US 2009/0211040 A1 Aug. 27, 2009

(30) Foreign Application Priority Data

Feb. 26, 2008 (JP) .................................. 2008-44327

(51) Int. Cl.
*A46B 13/00* (2006.01)
(52) U.S. Cl. ................ 15/77; 15/102; 15/88.2; 134/902
(58) Field of Classification Search .................. 15/21.1, 15/77, 88.2, 88.4, 102; 134/902
See application file for complete search history.

(56) References Cited

U.S. PATENT DOCUMENTS

| | | | | |
|---|---|---|---|---|
| 4,935,981 A | * | 6/1990 | Ohtani et al. | ............... 15/88.2 |
| 5,144,711 A | * | 9/1992 | Gill, Jr. | ............... 15/97.1 |
| 5,829,087 A | | 11/1998 | Nishimura et al. | |
| 6,647,579 B2 | * | 11/2003 | Manfredi et al. | ............... 15/77 |
| 2002/0073495 A1 | | 6/2002 | Manfredi et al. | |

FOREIGN PATENT DOCUMENTS

| | | |
|---|---|---|
| JP | 3-52228 | 3/1991 |
| JP | 8-141518 | 6/1996 |
| JP | 10-242093 | 9/1998 |
| JP | 11-58202 | 3/1999 |

* cited by examiner

*Primary Examiner* — Laura C Guidotti
(74) *Attorney, Agent, or Firm* — Ostrolenk Faber LLP

(57) ABSTRACT

A substrate processing apparatus includes: a brush for cleaning a substrate; a seesaw member which is swingable with a support member serving as a fulcrum and which has a force point section at one side with respect to the fulcrum and an actuating point section at the other side with respect to the fulcrum; a pushing actuator arranged to give a driving force to the force point section of the seesaw member, thereby to swing the seesaw member around the fulcrum, thus giving, to the seesaw member, a pushing force for pushing the brush to the substrate; and a transmission member which has an affected point section for receiving, from the actuating point section of the seesaw member, a driving force given to the force point section, and which transmits, to the brush, a pushing force for pushing the same to the substrate.

8 Claims, 17 Drawing Sheets

SUBSTRATE PROCESSING APPARATUS

BACKGROUND OF THE INVENTION

1. Field of the Invention

The present invention relates to a substrate processing apparatus for cleaning a substrate with a brush. Examples of the substrate to be processed include a semiconductor wafer, a liquid-crystal-display-device substrate, a plasma-display substrate, an FED (Field Emission Display) substrate, an optical-disk substrate, a magnetic-disk substrate, a photo-magnetic-disk substrate, a photomask substrate and the like.

2. Description of Related Art

A sheet-feed type processing unit used in a substrate processing apparatus for producing semiconductor devices or liquid crystal display devices, has, for example, a spin chuck for substantially horizontally holding and rotating a substrate and a nozzle for supplying a treating liquid to the substrate thus held by the spin chuck. The processing unit for scrubbing-cleaning a substrate further has a brush for scrubbing-cleaning the substrate held by the spin chuck (See for example Japanese Unexamined Patent Publication No. 2001-9388).

The brush is held by a holding arm capable of pushing the brush to a substrate. The holding arm is connected to a brush moving mechanism arranged to move the holding arm such that the brush is moved toward or away from the substrate and that the brush, as being in contact with the substrate, is moved along the substrate.

At the time of scrubbing-cleaning the top face of the substrate, for example, a treating liquid is supplied to the substrate top face from a nozzle while the substrate is being rotated in a horizontal plane by the spin chuck. Further, with the brush pushed to the top face of the substrate by the holding arm, the brush moving mechanism moves the brush along the top face of the substrate.

The holding arm has, for example, a housing, a shaft of which lower end projects from the bottom of the housing, and a brush pushing actuator disposed above the shaft in the housing.

With the brush being in contact with or in the vicinity of the substrate held by the spin chuck, the actuator applies a load to the shaft. This causes the brush attached to the lower end of the shaft to be pushed to the surface of the substrate.

In apparatus of prior art, since the brush pushing actuator is disposed above the shaft, the holding arm is increased in vertical height. Accordingly, the processing unit having the holding arm mounted, is disadvantageously increased in vertical height.

On the other hand, when a substrate processing apparatus has a plurality of processing units, there are instances where the processing units are vertically stacked in order to restrain their footprint from being increased. When a substrate processing apparatus having such an arrangement uses processing units each having a holding arm having the arrangement above-mentioned, the substrate processing apparatus in its entirety is disadvantageously increased in vertical height. This makes it difficult to design the substrate processing apparatus within the height of the ceiling of a clean room. Alternatively, it will be difficult to do maintenances even though the designing in such a spatial limit is possible.

SUMMARY OF THE INVENTION

It is an object of the present invention to provide a substrate processing apparatus capable of cleaning a substrate with a brush, yet reducing the height of the apparatus.

A substrate processing apparatus according to the present invention comprises: a brush for cleaning a substrate; a seesaw member which is swingable with a support member serving as a fulcrum and which has a force point section at one side with respect to the fulcrum and an actuating point section at the other side with respect to the fulcrum; a pushing actuator arranged to give a driving force to the force point section of the seesaw member, thereby to swing the seesaw member around the fulcrum, thus giving, to the seesaw member, a pushing force for pushing the brush to the substrate; and a transmission member which has an affected point section for receiving, from the actuating point section of the seesaw member, a driving force given to the force point section, and which transmits, to the brush, a pushing force for pushing the same to the substrate.

According to the present invention, the provision of the seesaw member enhances the degree of freedom for arranging the pushing actuator. More specifically, as far as provision is made such that the pushing force for pushing the brush to the substrate is given from the pushing actuator to the force point section of the seesaw member, the pushing actuator may be disposed above, under or at a side of the seesaw member. Accordingly, proper disposition of the pushing actuator enables the substrate processing apparatus to be reduced in height.

According to the present invention, the driving force of the pushing actuator serving as a pushing force, is entered to the seesaw member, and this driving force is then transmitted to the brush from the seesaw member through the transmission member, thus causing the brush to be pushed to the substrate.

More specifically, the pushing actuator enters a driving force to the force point section of the seesaw member, enabling the seesaw member to be swung with the support member serving as a fulcrum. Then, when the seesaw member is swung by the pushing actuator, the driving force of the pushing actuator is first transmitted to the transmission member from the actuating point section of the seesaw member and then transmitted to the brush from the transmission member. This causes the brush to be pushed to the substrate.

Thus, a cleaning processing with the use of the brush can be executed on the substrate, yet restraining the overall height of the substrate processing apparatus from being increased.

According to an embodiment of the present invention, the seesaw member is so supported by the support member as to be swung along a vertical plane; the actuator is so disposed as to give a driving force to the force point section of the seesaw member from thereunder; and the transmission member includes a shaft which extends down to a position under the actuating point section of the seesaw member and of which lower end is connected to the brush.

According to the arrangement above-mentioned, the pushing actuator is disposed under the seesaw member. More specifically, the disposition of the pushing actuator under the seesaw member, reduces the substrate processing apparatus in vertical height.

The pushing actuator gives a driving force to the force point section of the seesaw member from below, thus enabling the seesaw member to be swung along a vertical plane. By this swing operation, the seesaw member can transmit the driving force from the actuating point section to the transmission member. Thus, the driving force is transmitted to the brush through the shaft, causing the brush to be pushed to the substrate.

Preferably, the substrate processing apparatus comprises a guide mechanism disposed at a side of the shaft for guiding the same in the axial direction thereof. According to the arrangement above-mentioned, since the guide mechanism is disposed at a side of the shaft, the substrate processing apparatus is reduced in vertical height. Further, since the guide mechanism is disposed for guiding the shaft in its axial direction, the shaft can be axially smoothly moved. This enables the brush connected to the lower end of the shaft to be securely pushed to the substrate.

Preferably, the substrate processing apparatus further comprises a rotation actuator disposed at a side of the shaft for integrally rotating the shaft and the brush. According to the arrangement above-mentioned, since the rotation actuator is disposed at a side of the shaft, the substrate processing apparatus is reduced in vertical height.

The integral rotation of the shaft and the brush by the rotation actuator may be executed during the substrate cleaning processing with the use of the brush or during a period of time that no substrate cleaning with the brush is executed (for example, while the brush is in the waiting position).

Preferably, the seesaw member has a void. According to the arrangement above-mentioned, the seesaw member can be reduced in weight. This not only achieves a weight saving of the substrate processing apparatus, but also improves the following properties while the driving force applied by the pushing actuator is transmitted to the brush.

Preferably, the distance between the force point section and the fulcrum is different from the distance between the actuating point section and the fulcrum. More specifically, the distance between the force point section and the fulcrum may be longer than the distance between the actuating point section and the fulcrum. According to the arrangement above-mentioned, the driving force of the pushing actuator is transmitted, as amplified by the principle of leverage, to the brush. Thus, there can be used, as the pushing actuator, an actuator which has a smaller driving force and which is accordingly reduced in size. Therefore, the overall height of the substrate processing apparatus can be further reduced.

Alternatively, the distance between the force point section and the fulcrum may be shorter than the distance between the actuating point section and the fulcrum. According to the arrangement above-mentioned, the driving force of the pushing actuator is transmitted, as attenuated, to the brush. Accordingly, even though the driving force applied from the pushing actuator to the force point section varies, the variation of the force given to the brush from the actuating point section through the transmission member is smaller than the variation of the driving force given to the force point section. Accordingly, even though the driving force given from the pushing actuator to the seesaw member is not controlled with high precision, the force given from the actuating point section to the transmission member can be kept substantially constant. Thus, the pushing pressure of the brush applied to a substrate can be readily controlled with high precision.

These and other features, advantages and operational effects of the present invention will be more fully apparent from the following detailed description set forth below when taken in conjunction with the accompanying drawings.

DETAILED DESCRIPTION OF PREFERRED EMBODIMENTS

Figure 1:
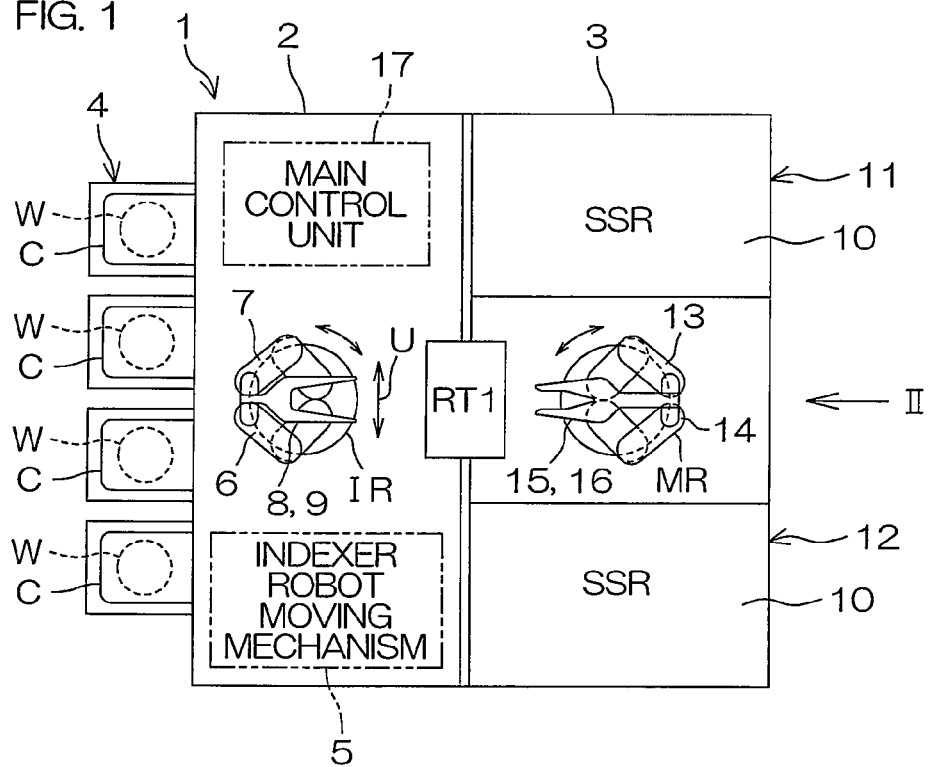
FIG. 1 is a schematic plan view illustrating the layout of a substrate processing apparatus according to an embodiment of the present invention.
Figure 2:
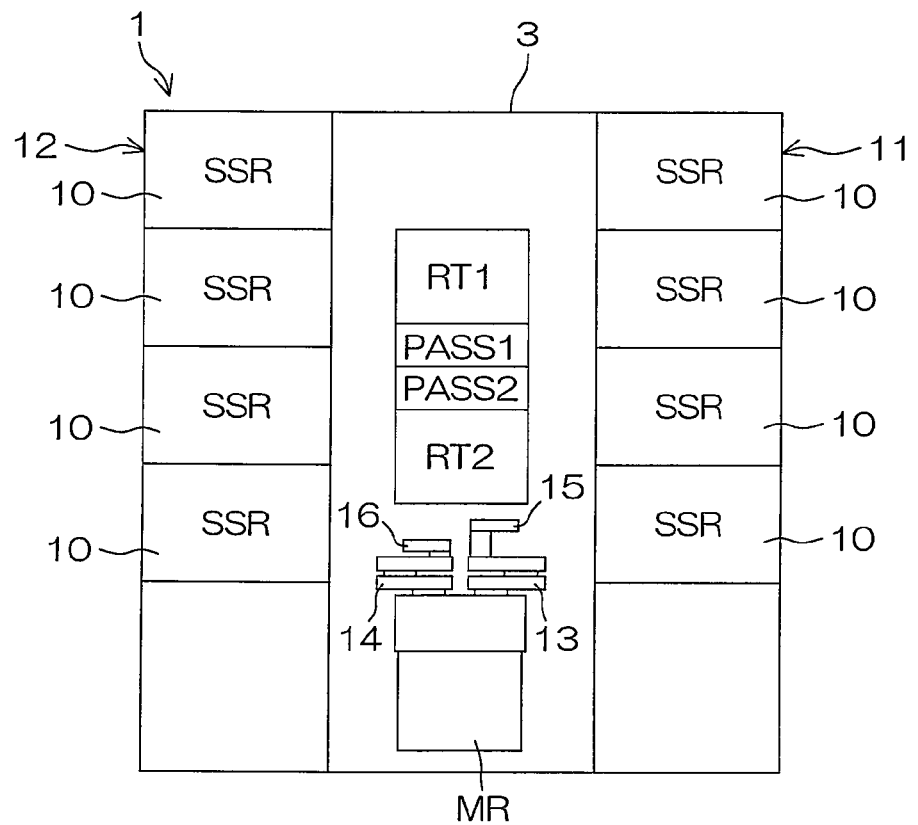
FIG. 2 is a schematic front view of the substrate processing apparatus taken from the direction II in FIG. 1.
Figure 3:
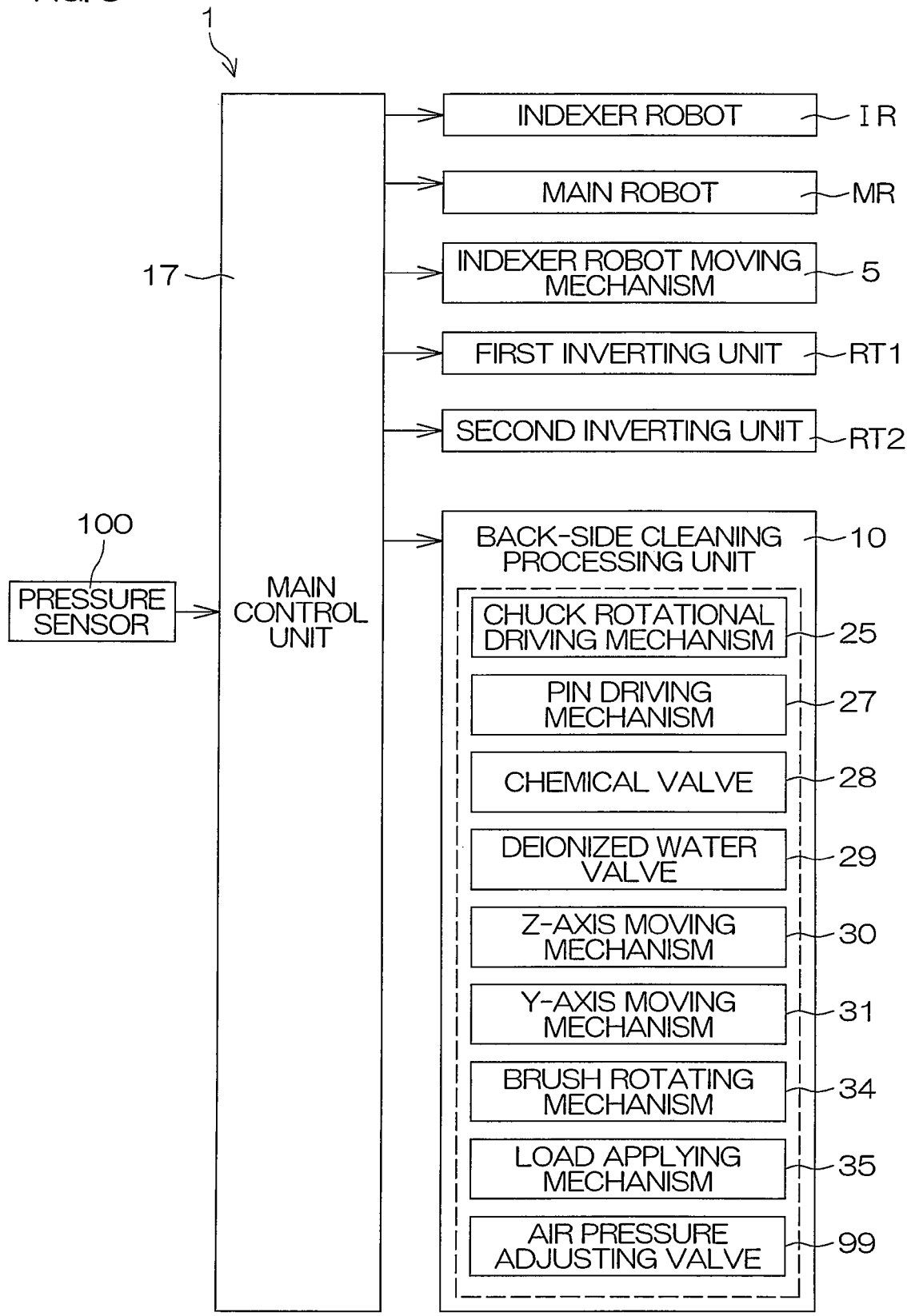
FIG. 3 is a block diagram illustrating the electric arrangement of the substrate processing apparatus.

FIG. 1 is a schematic plan view illustrating the layout of a substrate processing apparatus according to an embodiment of the present invention. FIG. 2 is a schematic front view of the substrate processing apparatus taken from the direction II in FIG. 1. FIG. 3 is a block diagram illustrating the electric arrangement of the substrate processing apparatus. This substrate processing apparatus 1 is arranged to execute, on a substrate W such as a semiconductor wafer, a variety of processing, e.g., a cleaning processing or the like. The substrate processing apparatus 1 has an indexer block 2 and a processing block 3 connected thereto.

The indexer block 2 has a carrier holding unit 4, an indexer robot IR and an indexer robot moving mechanism 5 (hereinafter referred to as an IR moving mechanism 5). The carrier holding unit 4 is capable of holding carriers C in each of which a plurality of substrates W can be housed. The indexer robot IR is arranged to execute, with respect to a carrier C held in the carrier holding unit 4, a carrying-in operation of a processed substrate W and a carrying-out operation of an unprocessed substrate W. The IR moving mechanism 5 has a function of horizontally moving the indexer robot IR.

More specifically, the carrier holding unit 4 is capable of holding a plurality of (for example, four) carriers C. In each carrier C, a plurality of substrates W are substantially horizontally held at intervals in a vertical direction. Substantially horizontally held by a carrier C are substrates W each with the top face thereof turned up, the top face being provided thereon with a device forming zone.

As each of the carriers C, there may be used, for example, a FOUP (Front Opening Unified Pod) arranged to house substrates W in a sealing manner, an SMIF (Standard Mechanical Interface) pod, an OC (Open Cassette) or the like.

Provision is made such that the carriers C are held, as arranged in a predetermined disposition direction U (hereinafter referred to as the carrier disposition direction U), by the carrier holding unit 4. The IR moving mechanism 5 is capable of moving the indexer robot IR in this carrier disposition direction U.

The IR moving mechanism 5 has, for example, a linear guide (not shown) and a drive mechanism (not shown). The linear guide is disposed as extending along the indexer robot IR moving direction (i.e., the carrier disposition direction U) for guiding the movement of the indexer robot IR. The drive mechanism is formed by a belt mechanism, a ball screw mechanism and other mechanisms for driving and controlling the moving operation of the indexer robot IR along the linear guide.

The indexer robot IR has a first upper hand 8 attached to the tip of a first upper arm 6, and a first lower hand 9 attached to the tip of a first lower arm 7. The first upper hand 8 and the first lower hand 9 are disposed at different positions in a vertical direction to prevent the hands 8, 9 from interfering with each other. The indexer robot IR can hold a substrate W by the first upper hand 8 and the first lower hand 9.

The indexer robot IR incorporates a first rotational driving mechanism (not shown). The first rotational driving mechanism can rotate, around a predetermined vertical axis, the first upper hand 8 and the first lower hand 9 together with the corresponding arms 6, 7. Further, the indexer robot IR incorporates a first vertical moving mechanism (not shown). This first vertical moving mechanism can vertically move the first upper hand 8 and the first lower hand 9 together with the corresponding arms 6, 7.

The first upper hand 8 and the first lower hand 9 can face a carrier C by moving the indexer robot IR in the carrier disposition direction U by the IR moving mechanism 5, and by rotating the first upper hand 8 and the first lower hand 9 around a predetermined vertical axis by the first rotational driving mechanism. With the first upper hand 8 and the first lower hand 9 being opposite to a carrier C, the indexer robot IR is operated to extend the arms 6, 7 such that the carrier C can be accessed by the hands 8, 9 attached to the tips of the arms 6, 7.

On the other hand, the processing block 3 has a plurality of processing units 10 arranged to execute a processing on a substrate W, and a main robot MR. The main robot MR is arranged to execute a carrying-in operation of an unprocessed substrate W to a plurality of processing units 10, and a carrying-out operation of a processed substrate W from the processing units 10. In this embodiment, for example eight processing units 10 are disposed.

Eight processing units 10 are divided into a first processing unit section 11 and a second processing unit section 12 in each of which four processing units 10 are vertically piled up. The first and second processing unit sections 11, 12 are disposed side by side with a predetermined space provided therebetween in the carrier disposition direction U. As shown in FIG. 1, the first and second processing unit sections 11, 12 and the carrier holding unit 4 are disposed with a predetermined space provided therebetween in the direction at a right angle to the carrier disposition direction U. The main robot MR is disposed between the first processing unit section 11 and the second processing unit section 12, while the indexer robot IR is disposed between the first and second processing unit sections 11, 12 and the carrier holding unit 4.

In each of the processing units 10, provision is made such that a substrate W is subjected, for example, to a back-side cleaning processing for scrubbing the back side of the substrate opposite to the top face thereof. In the following, the processing units 10 will also be referred to as back-side cleaning processing units 10.

The main robot MR has a second upper hand 15 attached to the tip of the second upper arm 13 and the second lower hand 16 attached to the tip of the second lower arm 14. The second upper hand 15 and the second lower hand 16 are disposed at different positions in a vertical direction to prevent the hands 15, 16 from interfering with each other. The main robot MR can hold a substrate W with the second upper hand 15 and the second lower hand 16.

The main robot MR incorporates a second rotational driving mechanism (not shown). The second rotational driving mechanism can rotate, around a predetermined vertical axis, the second upper hand 15 and the second lower hand 16 together with the corresponding arms 13, 14. Further, the main robot MR incorporates a second vertical moving mechanism (not shown). This second vertical moving mechanism can vertically move the second upper hand and the second lower hand 16 together with the corresponding arms 13, 14.

The second upper hand 15 and the second lower hand 16 can face a back-side cleaning processing unit 10 by rotating the second upper hand 15 and the second lower hand 16 around a predetermined vertical axis by the second rotational driving mechanism, and by vertically moving the second upper hand 15 and the second lower hand 16 by the second vertical moving mechanism. With the second upper hand 15 and the second lower hand 16 being opposite to the back-side cleaning processing unit 10, the main robot MR is operated to extend the arms 13, 14 such that the back-side cleaning processing unit 10 can be accessed by the hands 15, 16 attached to the tips of the arms 13, 14.

Disposed at the boundary portion between the indexer block 2 and the processing block 3 are first and second inverting units RT1, RT2 each for inverting a substrate W, and substrate placing portions PASS1, PASS2 each for delivering a substrate W between the indexer robot IR and the main robot MR. The first inverting unit RT1 is disposed above the substrate placing portions PASS1, PASS2, while the second inverting unit RT2 is disposed under the substrate placing portions PASS1, PASS2. Each of the first and second inverting units RT1, RT2 is capable of substantially horizontally holding a substrate W and of inverting the top face and back-side face of a substrate W as held thereby.

Each of the first and second inverting units RT1, RT2 has, for example, a fixed plate which is substantially horizontally disposed, a movable plate which is disposed in parallel to the fixed plate and can be moved, in parallel thereto, toward or away from the fixed plate, and a rotational driving mechanism for integrally rotating these fixed and movable plates. Provision is made such that a substrate W is substantially horizontally held between the fixed plate and the movable plate. With a substrate W held between the fixed and movable plates, the rotational driving mechanism rotates the fixed and movable plates integrally such that the substrate W is vertically inverted.

The upper substrate placing portion PASS1 is used for delivering a substrate W from the processing block 3 to the indexer block 2, while the lower substrate placing portion PASS2 is used for delivering a substrate W from the indexer block 2 to the processing block 3.

Each of the substrate placing portions PASS1, PASS2 has an optical sensor (not shown) for detecting the presence/absence of a substrate W. It is therefore possible to judge whether or not a substrate W is placed on the substrate placing portion PASS1, PASS2. Further, each of the substrate placing portions PASS1, PASS2 has a plurality of support pins (not shown) for supporting the underside of a substrate W. When delivering a substrate W between the indexer robot IR and the main robot MR, the substrate W is temporarily placed on the support pins of the substrate placing portion PASS1, PASS2.

The operations of the indexer robot IR, the main robot MR and the first and second inverting units RT1, RT2 are to be controlled by a main control unit 17 disposed at the indexer block 2. The main control unit 17 includes a computer or the like containing a CPU (Central Processing Unit).

As shown in FIG. 3, connected to the main control unit 17 are the indexer robot IR, the main robot MR, the IR moving mechanism 5, the first inverting unit RT1, the second inverting unit RT2 and the back-side cleaning processing units 10, as elements to be controlled by the main control unit 17.

The substrate processing operation by the substrate processing apparatus 1 is controlled by the main control unit 17.

First, the indexer robot IR takes out, with the use of the first lower hand 9, an unprocessed substrate W from a carrier C held by the carrier holding unit 4. At this time, the top face of the substrate W is turned up. The first lower hand 9 of the indexer robot IR holds the back side of the substrate W at its peripheral edge and circumferential end portion. While moving in the carrier disposition direction U, the indexer robot IR is rotated around a vertical axis and places the unprocessed substrate W on the substrate placing portion PASS2.

The substrate W placed on the substrate placing portion PASS2 is received by the main robot MR and then carried in the second inverting unit RT2. At the second inverting unit RT2, the substrate W with its top face turned up is inverted such that its back-side is turned up. The substrate W after inverted, is carried out from the second inverting unit RT2 by the main robot MR, and then carried in a back-side cleaning processing unit 10. In the back-side cleaning processing unit 10, a cleaning operation is conducted on the back side of the substrate W.

By the main robot MR, the substrate W of which back side has been cleaned, is carried out from the back-side cleaning processing unit 10 and then carried in the first inverting unit RT1. At the first inverting unit RT1, the substrate W with its back-side turned up is vertically inverted such that its top face is turned up. By the main robot MR, the substrate W after inverted is carried out from the first inverting unit RT1 and then placed on the substrate placing portion PASS1. The substrate W placed on the substrate placing portion PASS1 is received by the indexer robot IR and then housed in a carrier C.

Figure 4:
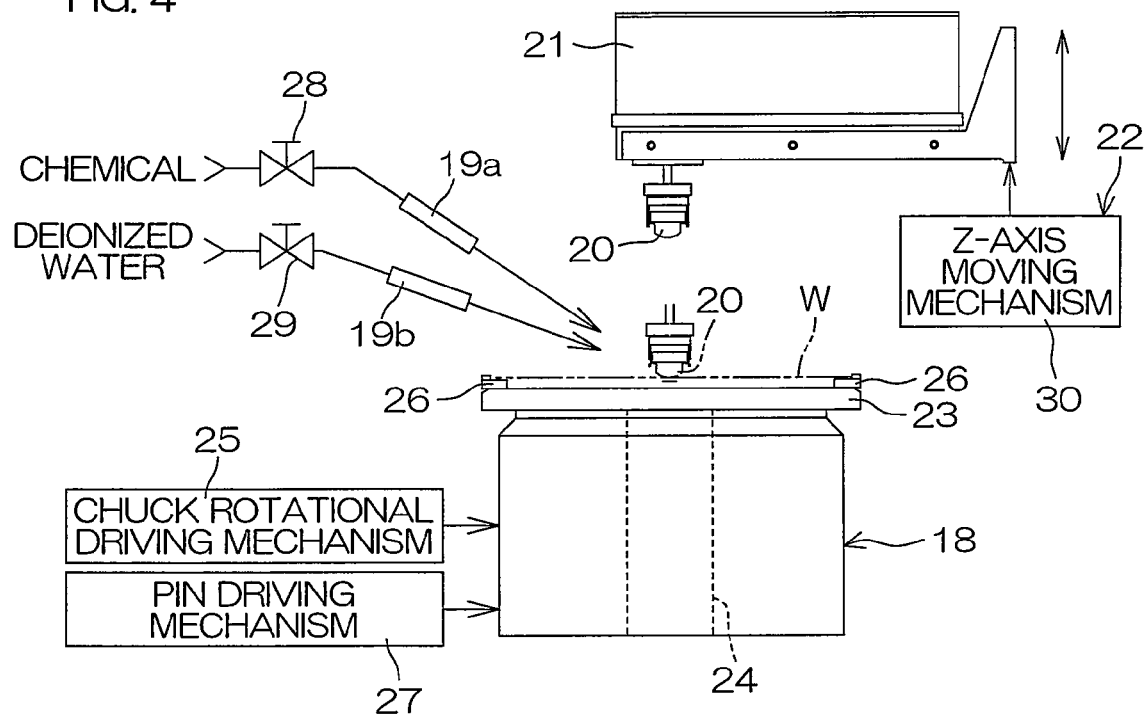
FIG. 4 is a schematic front view of the arrangement of a back-side cleaning processing unit.
Figure 5:
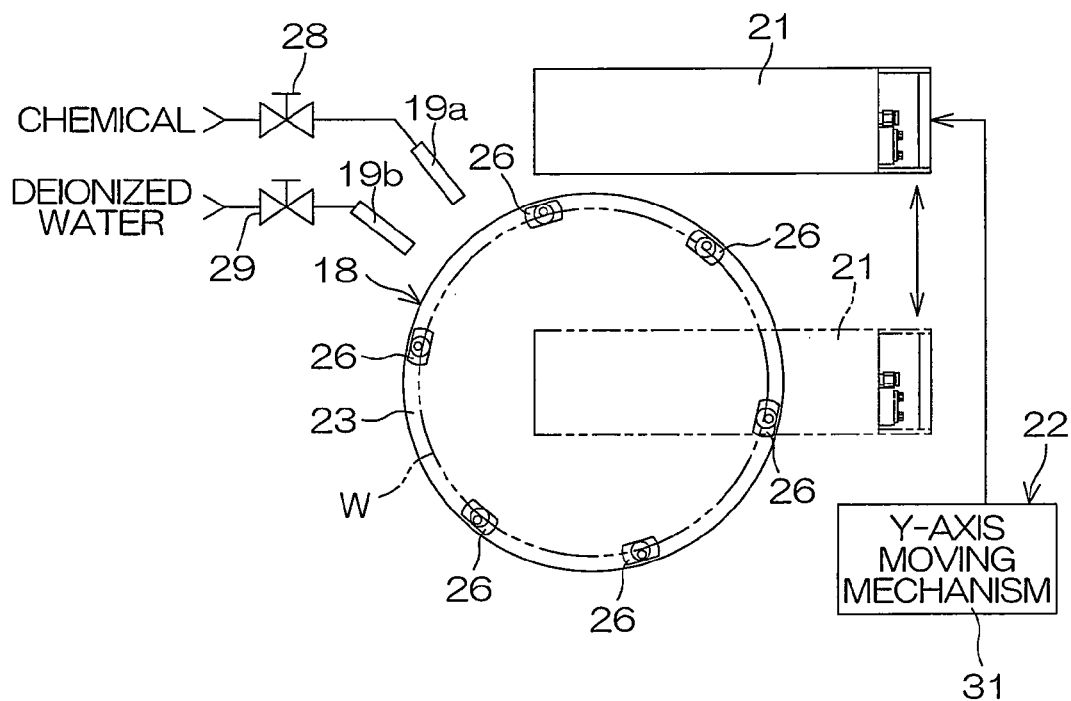
FIG. 5 is a schematic plan view of the arrangement of the back-side cleaning processing unit.

FIG. 4 is a schematic front view of the arrangement of a back-side cleaning processing unit 10, and FIG. 5 is a schematic plan view of the arrangement of the back-side cleaning processing unit 10.

Each of the back-side cleaning processing units 10 has a processing chamber (not shown), a spin chuck 18 for substantially horizontally holding and rotating a substrate W, a chemical nozzle 19a for supplying a chemical onto the substrate W held by the spin chuck 18, a deionized water nozzle 19b for supplying deionized water, and a brush 20 for scrubbing-cleaning the substrate W held by the spin chuck 18. These spin chuck 18, the chemical nozzle 19a, the deionized water nozzle 19b and the brush 20 are housed in the processing chamber.

The brush 20 is, for example, a sponge-like member made of PVA (polyvinyl alcohol). The brush 20 is held by and under a holding arm 21 for pushing the brush 20 to a substrate W. The holding arm 21 is connected to a brush moving mechanism 22 arranged to move the holding arm 21 such that the brush 20 is moved toward or away from the substrate W and that the brush 20 is moved along the substrate W with the brush 20 being in contact therewith.

The spin chuck 18 has a disk-like spin base 23, a rotary shaft 24 which substantially horizontally holds the spin base 23 and which is rotatable around a vertical axis, and a chuck rotational driving mechanism 25 for giving a rotary force to the rotary shaft 24. As shown in FIG. 5, there are, on the top face of the spin base 23, a plurality of standing chuck pins 26 which can come in contact with the end face of the substrate W to hold the same. The plurality of chuck pins 26 are integrally driven by a pin driving mechanism 27. This arrangement enables the substrate W to be rotated while being substantially horizontally held.

According to this embodiment, provision is made such that an unprocessed substrate W with its back-side turned up is carried in the spin chuck 18 by the main robot MR, and a processed substrate W is carried out from the spin chuck 18 by the main robot MR.

The chemical nozzle 19a is disposed such that a chemical discharged therefrom is supplied to the substantial center of rotation of the substrate W held by the spin chuck 18. A chemical is supplied to the chemical nozzle 19a from a chemical supply source through a chemical valve 28. The deionized water nozzle 19b is disposed such that deionized water discharged therefrom is supplied to the substantial center of rotation of the substrate W held by the spin chuck 18. Deionized water as an example of a rinsing liquid is supplied to the deionized water nozzle 19b from a deionized water supply source through a deionized water valve 29.

That is, a chemical can be supplied to the substrate W from the deionized water nozzle 19b by opening the chemical valve 28, and deionized water can be supplied to the substrate W from the deionized water nozzle 19b by opening the deionized water valve 29. When with the spin chuck 18 being under rotation, a treating liquid (chemical or deionized water) is supplied to the substrate W substantially at its center of rotation, this treating liquid spreads, under action of a centrifugal force, on the top face (back side) of the substrate W substantially at its entire zone and then flows down from the peripheral edge of the substrate W to the outside.

As the chemical to be supplied to the chemical nozzle 19a, there can be used a solution containing at least one selected from the group consisting of a sulfuric acid, an acetic acid, a nitric acid, a hydrochloric acid, a fluorinated acid, ammonia water, a hydrogen peroxide solution. More specifically, there can be used, as the chemical, SC-1 (a mixed solution of ammonia and a hydrogen peroxide solution), TMAH (tetramethyl-ammonium-hydroxide:tetramethylammonium hydroxide). Examples of the rinsing liquid supplied to the deionized water nozzle 19b include deionized water, carbonated water, electrolytic ionized water, hydrogen water, ozone water, magnetic water and ammonia water of dilute concentration (for example about 1 ppm).

A brush moving mechanism 22 includes a Z-axis moving mechanism 30 for moving the holding arm 21 in a vertical direction (z-axis direction), and a Y-axis moving mechanism 31 for moving the holding arm 21 in a horizontal direction (Y-axis direction).

When the Z-axis moving mechanism 30 moves the holding arm 21 in a vertical direction, the brush 20 is vertically moved together with the holding arm 21. When the Y-axis moving mechanism 31 moves the holding arm 21 in a horizontal direction, the brush 20 is horizontally moved together with the holding arm 21. Thus, the brush 20 can be horizontally moved above the substrate W and can also be vertically moved toward or away from the substrate W.

In scrubbing-cleaning the back side of a substrate W, a chemical is supplied to the top face of the substrate W from the chemical nozzle 19a while the substrate W is being rotated in a horizontal plane by the spin chuck 18. Further, the brush 20 is pushed onto the top face of the substrate W by the Z-axis moving mechanism 30 and the holding arm 21. With the brush 20 pushed onto the substrate W, the brush 20 is moved along the top face of the substrate W by the Y-axis moving mechanism 31. This causes the brush 20 to be moved from the center of rotation of the substrate W to its peripheral portion. During this movement, the brush 20 scans and scrubs the top face of the substrate W in its entirety.

After the scrubbing-cleaning has been executed, with the brush 20 separated from the substrate W, the deionized water nozzle 19b supplies deionized water to the substrate W under rotation. Thus, the top face of the substrate W is washed, causing foreign matter such as the chemical, particles or the like to be removed from the top face of the substrate W. After the supply of deionized water to the substrate W, there is executed a drying processing in which the rotational speed of the substrate W is raised to a predetermined high speed such that the deionized water on the substrate W is shaken off by a centrifugal force produced by the rotation of the substrate W, thereby to dry the substrate W. Upon completion of the drying processing, the rotation of the substrate W by the spin chuck 18 is stopped and the processed substrate W is carried out from the spin chuck 18 by the main robot MR.

Figure 6:
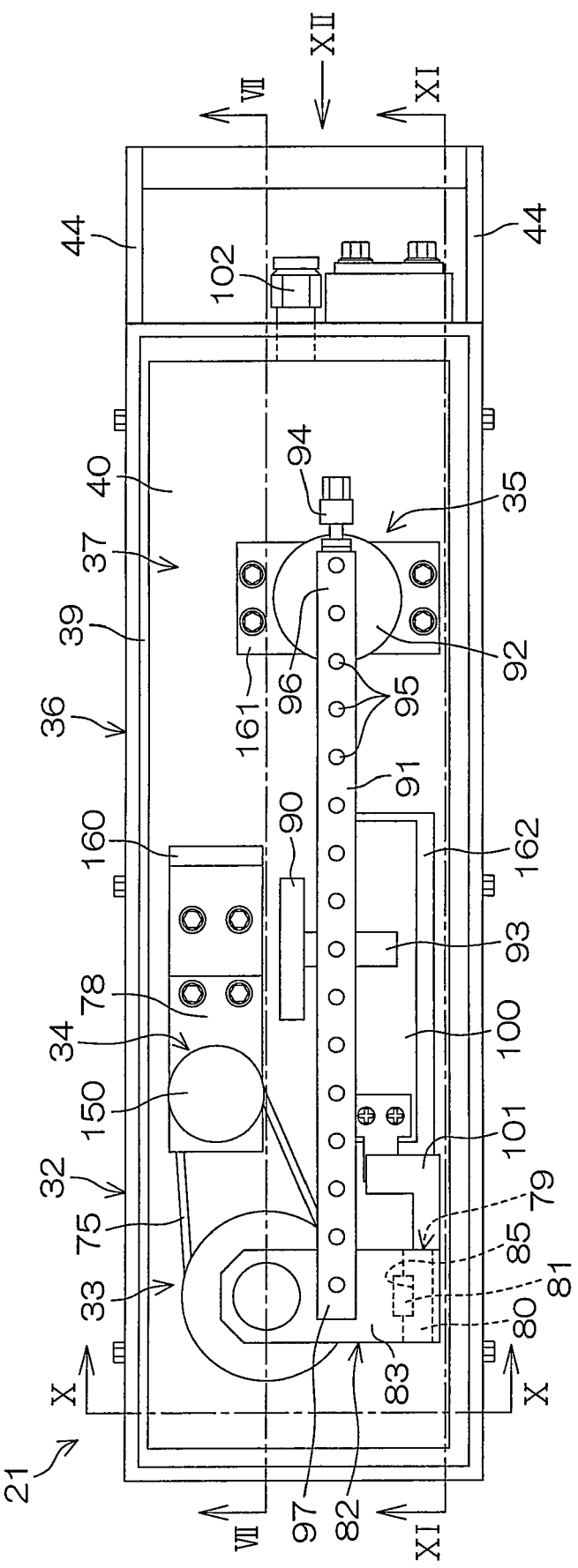
FIG. 6 is a plan view of a holding arm.
Figure 7:
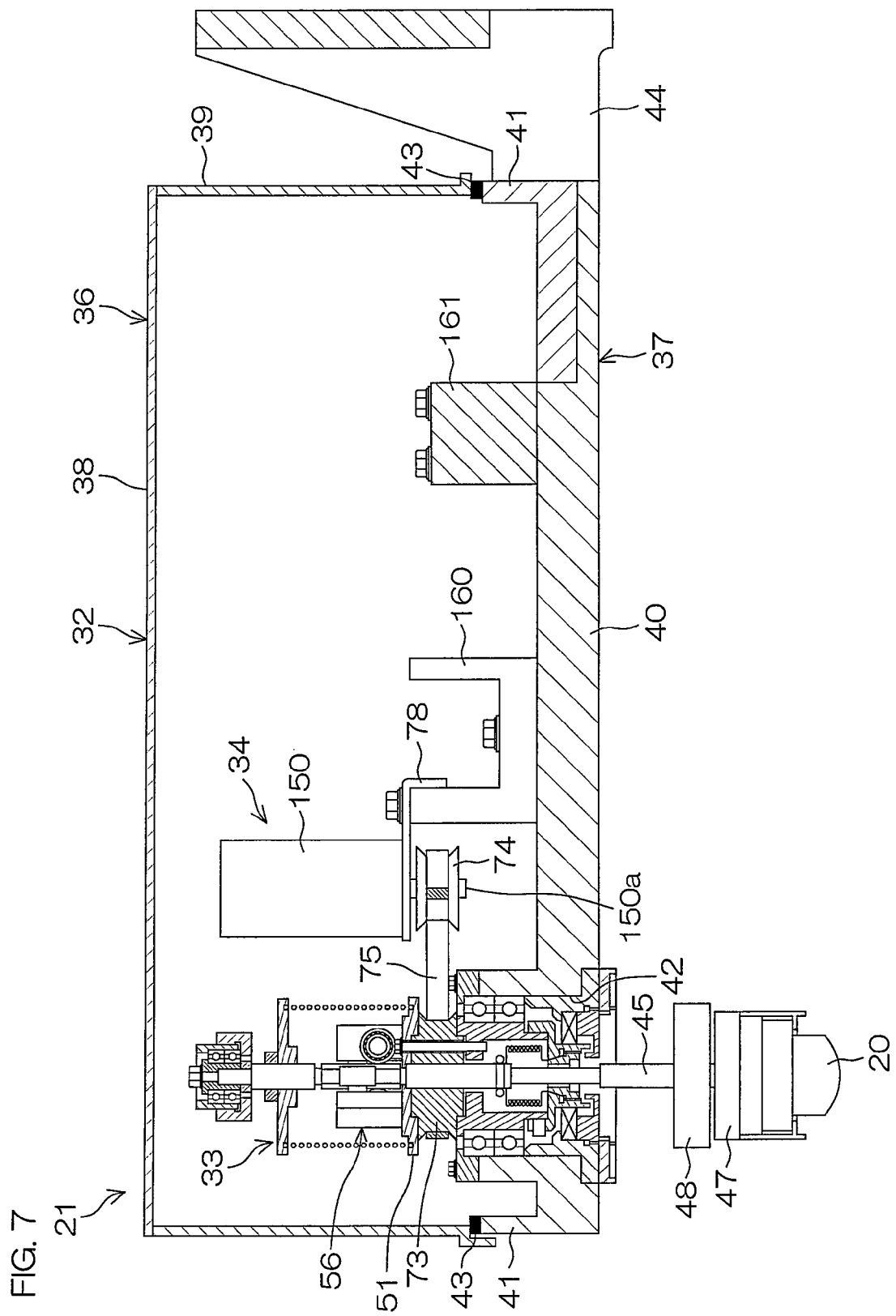
FIG. 7 is a longitudinal section view of the holding arm taken along the line VII-VII in FIG. 6.

FIG. 6 is a plan view of the holding arm 21, while FIG. 7 is a longitudinal section view of the holding arm 21 taken along the line VII-VII in FIG. 6. In FIG. 6, the illustration of a housing 32 at its part (upper plate 38 to be discussed later) is omitted.

The holding arm 21 has a substantially rectangular box-shape housing 32, a brush holding mechanism 33 for holding the brush 20, a brush rotating mechanism 34 for rotating the brush 20 around a vertical axis, and a load applying mechanism 35 for applying a vertically downward load to the brush 20. The brush holding mechanism 33, the brush rotating mechanism 34 and the load applying mechanism 35 are housed in the housing 32.

As shown in FIG. 7, the housing 32 includes an upper housing portion 36 and a lower housing portion 37 which are fitted to each other. The upper housing portion 36 is in a rectangular box shape of which lower end is open. The upper housing portion 36 includes a rectangular upper plate 38, and a casing-like peripheral wall 39 connected to the upper plate 38. The lower housing portion 37 is substantially in a rectangular box shape of which upper end is open. The lower housing portion 37 includes a rectangular bottom 40 and a peripheral wall 41 formed along the circumference of the bottom 40.

As shown in FIG. 7, the lower end of the peripheral wall 39 of the upper housing portion 36 is fitted on the upper end of the peripheral wall 41 of the lower housing portion 37. An annular packing 43 is disposed between the peripheral wall 39 and the peripheral wall 41. The gap between the upper housing portion 36 and the lower housing portion 37 is suitably sealed by this packing 43. That is, the packing 43 is, for example, a sponge-like member which permits gas to circulate reasonably.

As shown in FIG. 6, a pair of lateral plates 44 are fixed to the outer circumferential face of the lower housing portion 37. The Z-axis moving mechanism 30 and the Y-axis moving mechanism 31 mentioned earlier are connected to the holding arm 21 through this pair of lateral plates 44. Further, as shown in FIG. 7, the bottom 40 is provided in its tip side (the left side in FIG. 7) with an inserting hole 42 through which the brush holding mechanism 33 passes.

Figure 8:
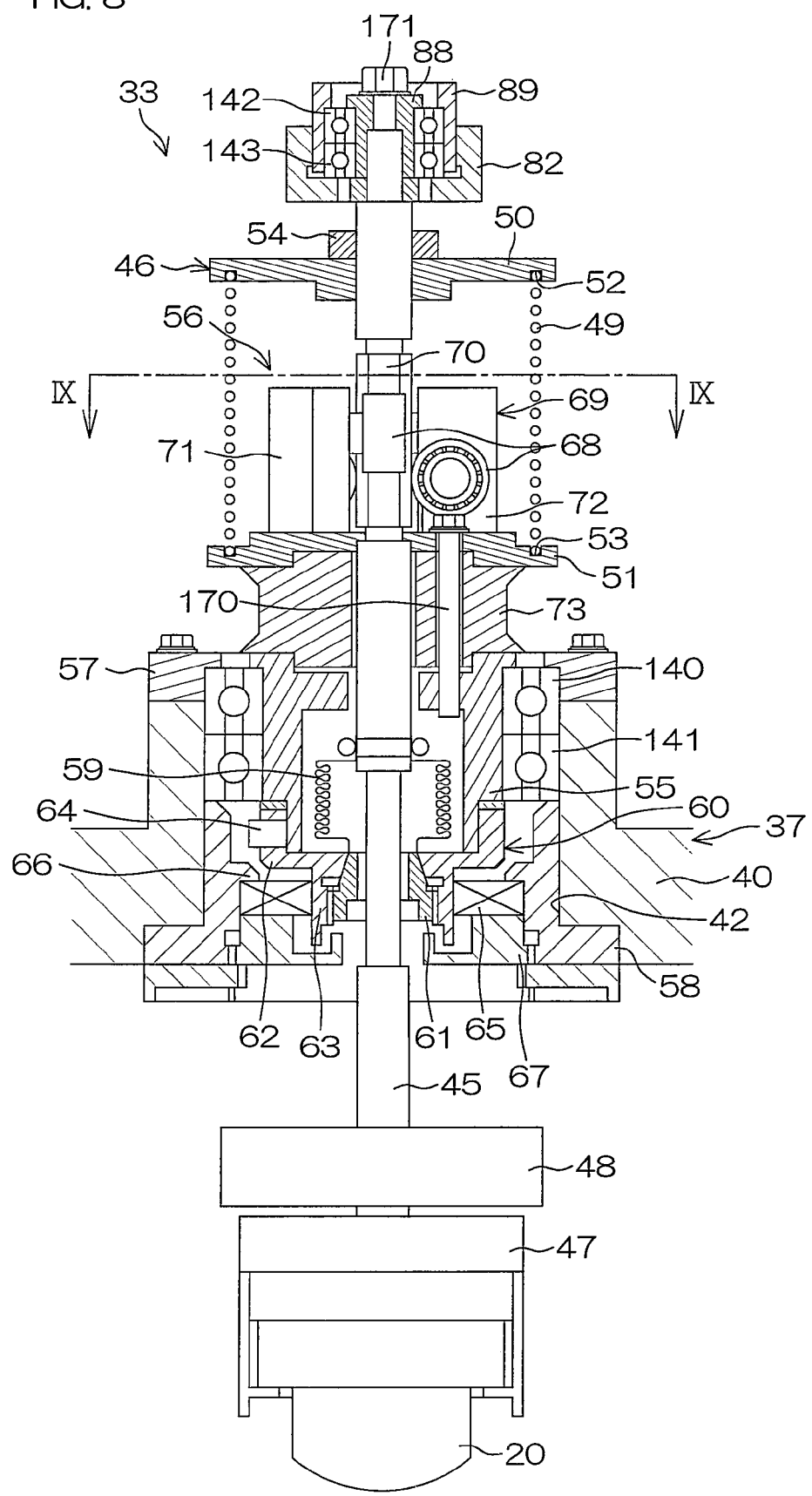
FIG. 8 is an enlarged section view of a brush holding mechanism.

FIG. 8 is an enlarged section view of the brush holding mechanism 33.

The brush holding mechanism 33 includes a rotary shaft 45 as a vertically extending shaft, and a supporting mechanism 46 for vertically movably supporting this rotary shaft 45.

The rotary shaft 45 passes through the inserting hole 42 formed in the bottom 40 of the lower housing portion 37. The upper end of the rotary shaft 45 extends in the vicinity of the upper plate 38 of the upper housing portion 36, while the lower end of the rotary shaft 45 projects downwardly from the underside of the lower housing portion 37 (See FIG. 7).

Disposed at the lower end of the rotary shaft 45 is a holder attaching unit 48 to which a brush holder 47 is attached. The brush 20 is held by this brush holder 47. The lower end of the brush 20 projects downwardly with respect to the brush holder 47. According to this embodiment, the underside of the brush 20 serves as a substrate W cleaning surface.

The supporting mechanism 46 includes a coil spring 49 which is for example cylindrical, and first and second engaging members 50, 51 which engage with this coil spring 49. Each of the first and second engaging members 50, 51 is an annular plate-like member. The rotary shaft 45 passes through the first and second engaging members 50, 51. The first and second engaging members 50, 51 are substantially horizontally disposed with a space provided therebetween in a vertical direction. The first engaging member 50 is disposed above the second engaging member 51.

That opposite face (underside) of the first engaging member 50 facing the second engaging member 51, is provided in the peripheral edge thereof with a first engaging groove 52 in which the upper end of a coil spring 49 engages. That opposite face (top face) of the second engaging member 51 facing the first engaging member 50, is provided in the peripheral edge thereof with a second engaging groove 53 in which the lower end of the coil spring 49 is engaged. The coil spring 49 is put on the rotary shaft 45 and disposed between the first and second engaging members 50, 51. The upper and lower ends of the coil spring 49 are respectively engaged with the first engaging groove 52 and the second engaging groove 53. Provision is made such that the coil spring 49 is compressed between the first and second engaging members 50, 51.

The first engaging member 50 is integrally rotatably connected to the rotary shaft 45. Disposed above the first engaging member 50 is a press nut 54 connected to the rotary shaft 45. Provision is made such that the first engaging member 50 as pushed by the press nut 54 is downwardly moved together with the rotary shaft 45.

The second engaging member 51 is supported by the lower housing portion 37 through a first pulley 73, a first case-like housing 55 and a pair of bearings 140, 141, all of which are disposed under the second engaging member 51. The second engaging member 51, the first pulley 73, the first case-like housing 55 and the pair of bearings 140, 141 are restrained from being moved in a vertical direction with respect to the lower housing portion 37. The rotary shaft 45 passes through the first pulley 73, the first case-like housing 55 and the pair of bearings 140, 141, and is movable in a vertical direction with respect to the second engaging member 51, the first pulley 73, the first case-like housing 55 and the pair of bearings 140, 141.

The own weights of the rotary shaft 45, the brush 20 and the like are transmitted to the first engaging member 50 through the press nut 54, and then transmitted from the first engaging member 50 to the coil spring 49. Accordingly, the coil spring 49 is downwardly pushed by the own weights of the rotary shaft 45, the brush 20 and the like. Produced at the coil spring 49 is flexure corresponding to the own weights of the rotary shaft 45, the brush 20 and the like. The rotary shaft 45, the brush 20 and the like are vertically resiliently supported by the elastic reaction force of the coil spring 49. Accordingly, the own weights of the rotary shaft 45, the brush 20 and the like are cancelled by the elastic reaction force of the coil spring 49. Therefore, with no influence of these own weights, a force designed to be applied by a pushing actuator 92 can be given to the brush 20. It is therefore possible to control, with high precision, the pushing pressure of the brush 20 to the substrate W.

When a vertically downward load is applied to the rotary shaft 45, the rotary shaft 45 is vertically downwardly moved together with the brush 20 and the like. Here, the load applied to the rotary shaft 45 is exerted to the coil spring 49 through the first engaging member 50. Accordingly, there is produced, at the coil spring 49, flexure corresponding to the magnitude of the load applied to the rotary shaft 45. When the vertically downward load applied to the rotary shaft 45 is removed, the rotary shaft 45 is upwardly moved by the elastic reaction force of the coil spring 49 up to the original position occupied before the load is applied. It is noted that the spring constant of the coil spring 49 is set to a very low value such that the reaction force corresponding to the flexure of the coil spring 49 does not have an influence upon the pushing precision of the brush 20 provided by the pushing actuator 92.

The second engaging member 51, the first pulley 73 and the first case-like housing 55 are integrally rotatably connected to one another by a bolt 170 for example. The first case-like housing 55 is rotatably supported by the lower housing portion 37 through the pair of bearings 140, 141. The first pulley 73 is disposed between the second engaging member 51 and the first case-like housing 55 in a vertical direction. The first pulley 73 forms a part of the brush rotating mechanism 34 mentioned earlier. Provision is made such that a turning force for rotating the rotary shaft 45 is entered to the first pulley 73.

When a turning force for rotating the rotary shaft 45 is entered into the first pulley 73, the second engaging member 51 and the first case-like housing 55 are integrally rotated together with the first pulley 73. The rotation of the second engaging member 51, the first pulley 73 and the first case-like housing 55 is transmitted to the rotary shaft 45 by a rotation transmitting mechanism 56 disposed in the space inside of the coil spring 49. This causes the rotary shaft 45 to be rotated around a vertical axis. The specific arrangement of the rotation transmitting mechanism 56 will be discussed later.

The pair of bearings 140, 141 are disposed with a gap provided therebetween in a vertical direction. In the present embodiment, for example, radial ball bearings are used as the bearings 140, 141. A case-like upper press member 57 fixed to the lower housing portion 37 is engaged with the upper end of the outer ring of the upper bearing 140. A case-like lower press member 58 fitted in the inserting hole 42 in the lower housing portion 37, is engaged with the lower end of the outer ring of the lower bearing 141. The pair of bearings 140, 141 are fixed to the lower housing portion 37 by the upper and lower press members 57, 58.

Disposed in the space inside of the first case-like housing 55 is a bellows 59 which surrounds the rotary shaft 45. The upper end of the bellows 59 is fixed to the rotary shaft 45 in the space inside of the first case-like housing 55. The lower end of the bellows 59 is fixed by a second case-like housing 60 fixed to the lower end of the first case-like housing 55 and also by a case-like bellows press member 61 fitted in the inner periphery of the second case-like housing 60. That is, the lower end of the bellows 59 is held by and between the inner periphery of the second case-like housing 60 and the outer periphery of the bellows press member 61.

The bellows 59 prevents the atmosphere containing the treating liquid in the processing chamber from entering inside of the housing 32. Also, the bellows 59 prevents dust generated in the housing 32 from flowing outside of the housing 32. This prevents dust generated in the housing 32 from sticking to the substrate W, thus restraining or preventing the substrate W from being contaminated.

The second case-like housing 60 includes a large-diameter portion 62 forming the upper end portion of the housing 60 and a small-diameter portion 63 forming the lower end portion of the housing 60. The large-diameter portion 62 is put on the lower end of the first case-like housing 55 and is integrally rotatably connected to the lower end of the first case-like housing 55 by a setscrew 64, for example. A magnetic fluid sealing 65 is disposed between the small-diameter portion 63 and the lower press member 58. The gap between the small-diameter portion 63 and the lower press member 58 is sealed by the magnetic fluid sealing 65.

Engaged with the upper end of the magnetic fluid sealing 65 is an annular flange 66 formed at the inner periphery of the lower press member 58. A case-like sealing press member 67 is engaged with the lower end of the magnetic fluid sealing 65. The magnetic fluid sealing 65 is held by and between the sealing press member 67 and the flange 66.

The magnetic fluid sealing 65 prevents the atmosphere containing the treating liquid in the processing chamber from entering into the housing 32. Further, for example, the bearings 140, 141 disposed above the magnetic fluid sealing 65 produce dust due to their wear with the rotation. The magnetic fluid sealing 65 prevents such dust from falling on the substrate W, thus restraining or preventing the substrate W from being contaminated.

Figure 9:
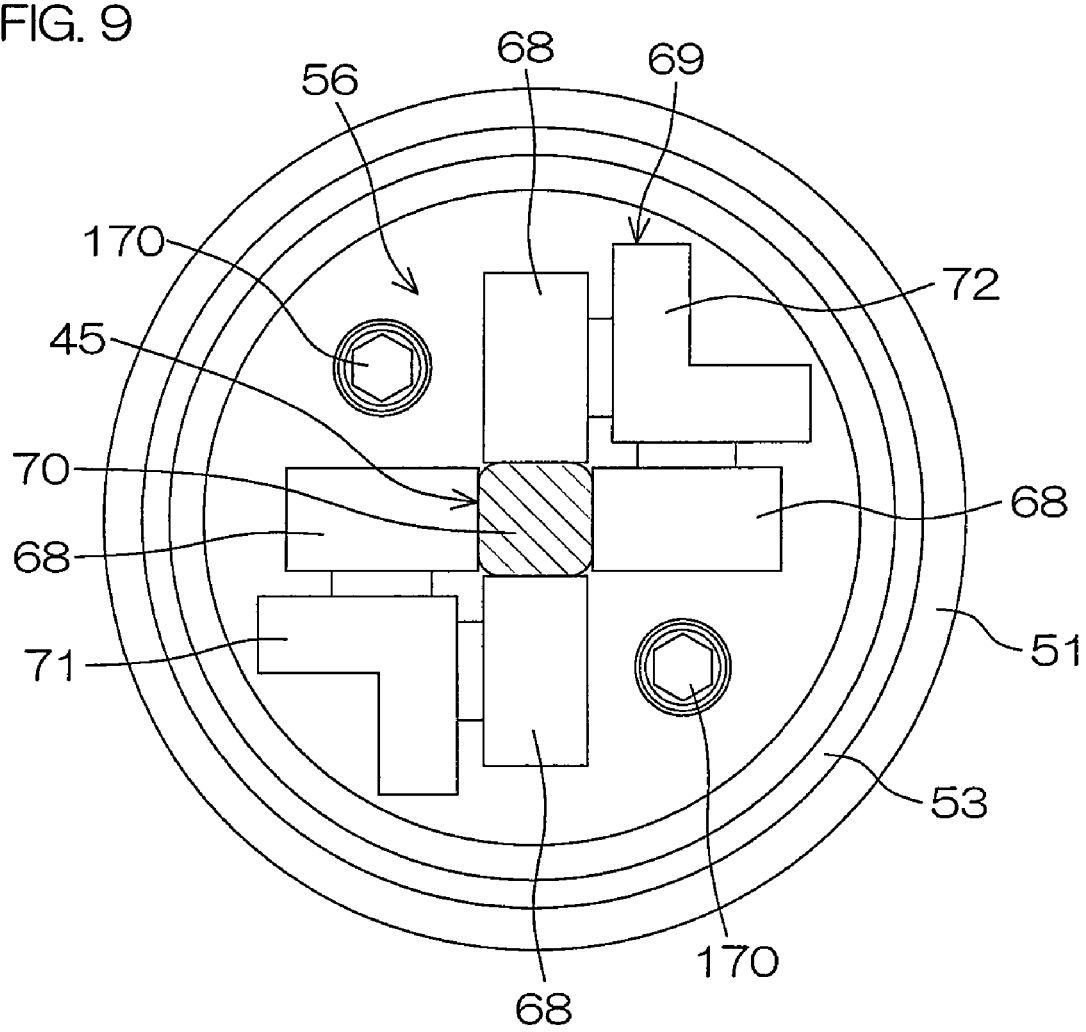
FIG. 9 is a cross section view of the brush holding mechanism taken along the line IX-IX in FIG. 8.

FIG. 9 is a cross section view of the brush holding mechanism 33 taken along the line IX-IX in FIG. 8. In the following, the description will be made of the rotation transmitting mechanism 56 with reference to FIGS. 8 and 9.

The rotation transmitting mechanism 56 is arranged to transmit a turning force to the rotary shaft 45 and to guide the same in the axial (vertical) direction. The rotation transmitting mechanism 56 has two pairs of guide rollers 68 and a roller supporting mechanism 69 for rotatably supporting the same.

Each of the guide rollers 68 is axially rotatably supported by the roller supporting mechanism 69, and is disposed such that its outer circumferential face comes in contact with the rotary shaft 45.

More specifically, the rotary shaft 45 has a guide roller contact portion 70 in a square pole form. The guide roller contact portion 70 includes four flat faces extending in the axial direction of the rotary shaft 45. The guide rollers 68 are disposed such that their outer circumferences respectively come in contact with different flat faces.

More specifically, as shown in FIG. 9, the guide rollers 68 are disposed at regular intervals in the circumferential direction of the rotary shaft 45 as if surrounding the same. Two guide rollers 68 forming a pair are opposite to each other with respect to the rotary shaft 45. As shown in FIG. 8, two guide rollers 68 forming one pair are disposed at positions different in vertical height from positions at which two guide rollers 68 forming the other pair are disposed.

On the other hand, the roller supporting mechanism 69 includes first and second roller supporting members 71, 72 which form a pair. As shown in FIG. 9, each of the first and second roller supporting members 71, 72 has an L shape in plan elevation and is opposite to each other with respect to the rotary shaft 45. Each of the first and second roller supporting members 71, 72 rotatably supports two guide rollers 68 adjacent in the circumferential direction of the rotary shaft 45. The first and second roller supporting members 71, 72 are formed integrally with the second engaging member 51 and extend upwardly from the top face thereof.

A turning force is transmitted from the second engaging member 51 to the first and second roller supporting members 71, 72. The turning force transmitted to the first and second roller supporting members 71, 72 is transmitted to the rotary shaft 45 through the contact portions at which the guide rollers 68 and the rotary shaft 45 are in contact with each other. This causes the rotary shaft 45 to be rotated around a vertical axis.

Further, when the rotary shaft 45 is vertically moved, each of the guide rollers 68 is axially rotated with the movement of the rotary shaft 45. This enables the rotary shaft 45 to be smoothly moved in a vertical direction. Since two pairs of guide rollers 68 are respectively disposed at positions different in a vertical direction, the rotary shaft 45 can travel in a straight line while being guided by the two pairs of guide rollers 68. The stability of the rotary shaft 45 in its vertical straight advance is enhanced by a first linear guide mechanism 79, to be discussed later.

With reference to FIGS. 6 and 7, the description will discuss the brush rotating mechanism 34 mentioned earlier.

The brush rotating mechanism 34 has the first pulley 73 mentioned earlier, a second pulley 74 forming a pair together with the first pulley 73, a belt 75 installed between the first and second pulleys 73, 74, and a motor 150 serving as a rotation actuator connected to the second pulley 74.

The motor 150 is disposed at a side of the rotary shaft 45 and has an output shaft 150*a* which is downwardly turned. The position of the upper end of the motor 150 is lower than the position of the upper end of the rotary shaft 45. This reduces the housing 32 in vertical height. The reduction in vertical height of the housing 32 reduces the vertical height of the holding arm 21, resulting in reduction in vertical height of the processing units 10. This reduces the substrate processing apparatus 1 in vertical height.

The motor 150 is fixed to the lower housing portion 37 through a pedestal 160 and a stay 78. The second pulley 74 is coaxially connected to the output shaft 150*a* of the motor 150. The second pulley 74 is to be rotationally driven by this motor 150. When the second pulley 74 is rotationally driven by this motor 150, the rotation of the second pulley 74 is transmitted to the first pulley 73 through the belt 75. Then, as mentioned earlier, the rotation transmitted to the first pulley 73 is transmitted to the rotary shaft 45 through the second engaging member 51 and the rotation transmitting mechanism 56. Thus, the rotary shaft 45 is rotated around a vertical axis, and together with the rotary shaft 45, the brush 20 is also rotated around a vertical axis.

The rotation of the brush 20 by the brush rotating mechanism 34 may be executed while the substrate W is being cleaned by the brush 20, or while no cleaning processing is being executed on the substrate W by the brush 20 (e.g., while the brush 20 is in a waiting position). The present embodiment is arranged such that the rotation of the brush 20 by the brush rotating mechanism 34 is executed while the brush 20 is in the waiting position.

Disposed at the brush 20 waiting position is a closed-end casing pod (not shown) for housing the brush 20. The brush 20 is rotated in this pod. Deionized water is supplied to the brush 20 in this pod. By supplying deionized water to the brush 20 under rotation, the deionized water is uniformly supplied to the brush 20. This not only washes out foreign matter attached to the brush 20, but also restrains or prevents the brush 20 from being dried.

Figure 10:
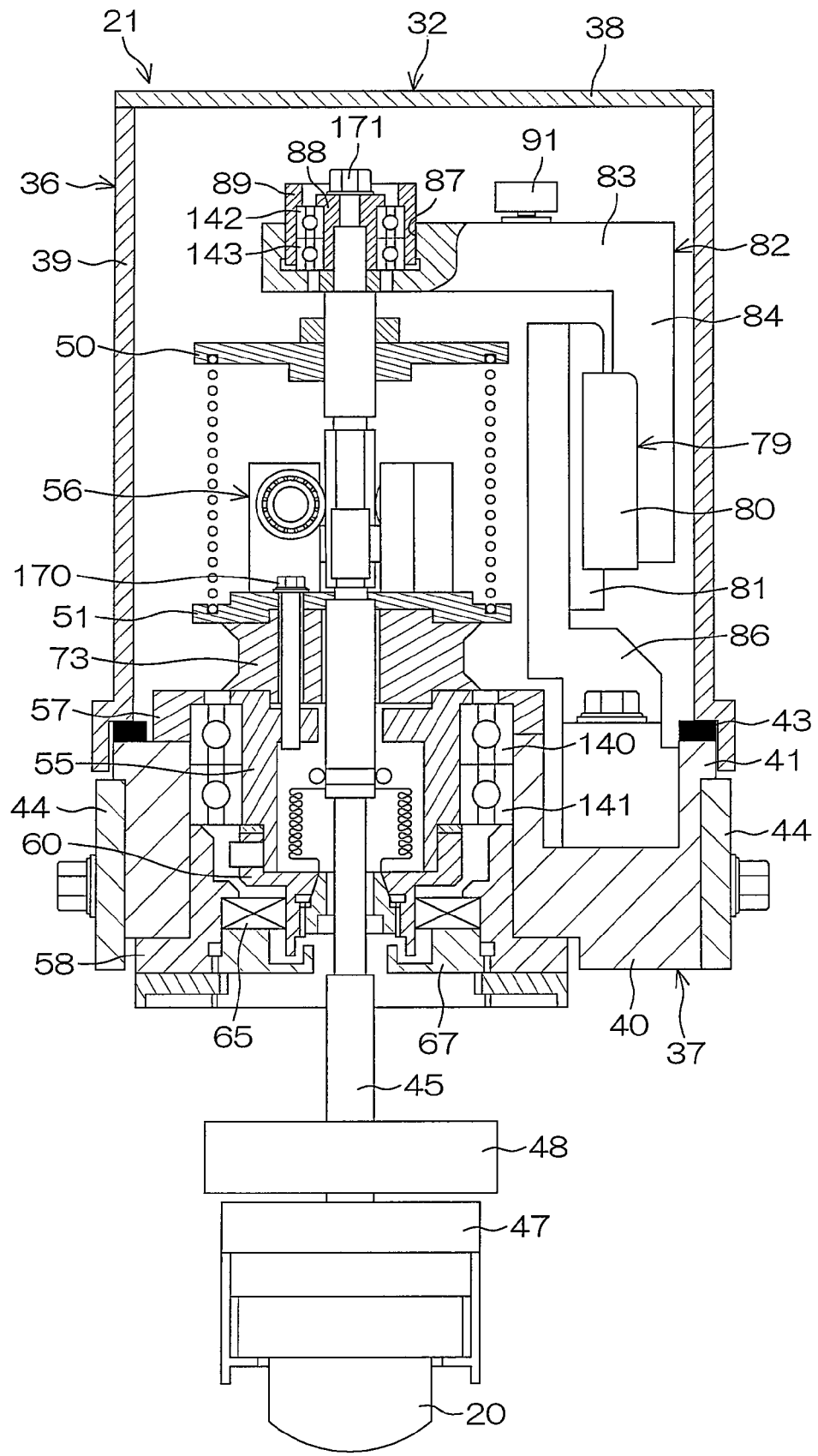
FIG. 10 is a longitudinal section view of the holding arm taken along the line X-X in FIG. 6.

FIG. 10 is a longitudinal section view of the holding arm 21 taken along the line X-X in FIG. 6. In the following, the description will be made of the first linear guide mechanism 79 mentioned earlier with reference to FIGS. 6 and 10.

The first linear guide mechanism 79 has a first slide portion 80 and a first linear guide 81 which forms a pair together with the first slide portion 80. As shown in FIG. 10, the first slide portion 80 and the first linear guide 81 vertically extend. The first slide portion 80 and the first linear guide 81 are disposed at a side of the rotary shaft 45, and the positions of the upper ends of these portion and guide 80, 81 are lower than the position of the upper end of the rotary shaft 45. This reduces the housing 32 in vertical height. This results in reduction in the vertical height of the substrate processing apparatus 1.

The first slide portion 80 is connected to the rotary shaft 45 through a bracket 82. As shown in FIG. 10, the bracket 82 includes a horizontally extending horizontal plate 83 (affected point section) and a vertical plate 84 vertically downwardly extending from one end (right end in FIG. 10) of the horizontal plate 83. The position of the top face of the horizontal plate 83 is slightly lower than the position of the upper end of the rotary shaft 45.

The first slide portion 80 is fixed to one end face (left-hand face in FIG. 10) of the vertical plate 84. The bracket 82 and the first slide portion 80 are vertically integrally movably connected to each other. As shown in FIG. 6, a vertically extending first slide groove 85 is formed in the first slide portion 80. The first linear guide 81 is fitted in this first slide groove 85.

As shown in FIG. 10, the first linear guide 81 is fixed to the lower housing portion 37 through a guide holding member 86 which holds the first linear guide 81. The first slide portion 80 is vertically slidable with respect to the first linear guide 81. The first linear guide 81 guides the vertical movement of the first slide portion 80. Accordingly, the bracket 82 which is vertically integrally moved together with the first slide portion 80, is also vertically guided by the first linear guide 81.

As shown in FIG. 10, a through-hole 87 is formed in the horizontal plate 83 at its other end (the left end in FIG. 10). The upper end of the rotary shaft 45 passes through the through-hole 87. A cylindrical boss 88 put on the upper end of the rotary shaft 45, is fixed thereto by a bolt 171. A portion of the boss 88 is disposed inside of the through-hole 87, and there are disposed, between this portion of the boss 88 and the bracket 82, a pair of bearings 142, 143 and a cylindrical lid member 89 for pressing this pair of bearings 142, 143.

The pair of bearings 142, 143 are disposed with a gap provided therebetween in a vertical direction and are put on the boss 88. In this embodiment, for example radial ball bearings are used as the bearings 142, 143. The lid member 89 is put on the pair of bearings 142, 143 and presses downwardly the outer ring of the upper bearing 142. The lid member 89 is fitted in the through-hole 87 and is fixed to the bracket 82.

The rotary shaft 45 and the boss 88 are so connected to the bracket 82 as to be rotatable around the axis of the rotary shaft 45. Further, the rotary shaft 45 and the boss 88 are integrally vertically movably connected to the bracket 82. More specifically, when the bracket 82 is vertically moved, the rotary shaft 45 is also vertically moved.

As mentioned earlier, since the bracket 82 is vertically guided by the first linear guide mechanism 79, the rotary shaft 45 to be vertically integrally movable together with the bracket 82 is also vertically guided by the first linear guide mechanism 79. More specifically, the rotary shaft 45 is arranged to be vertically guided by both the rotation transmitting mechanism 56 mentioned earlier and the first linear guide mechanism 79. This means that the stability of the vertical straight advance of the rotary shaft 45 is enhanced by the first linear guide mechanism 79. Since the rotary shaft 45 is axially guided by the rotation transmitting mechanism 56 and the first linear guide mechanism 79, the rotary shaft 45 can be axially smoothly moved. This enables the brush 20 to be securely pushed to the substrate W.

Figure 11:
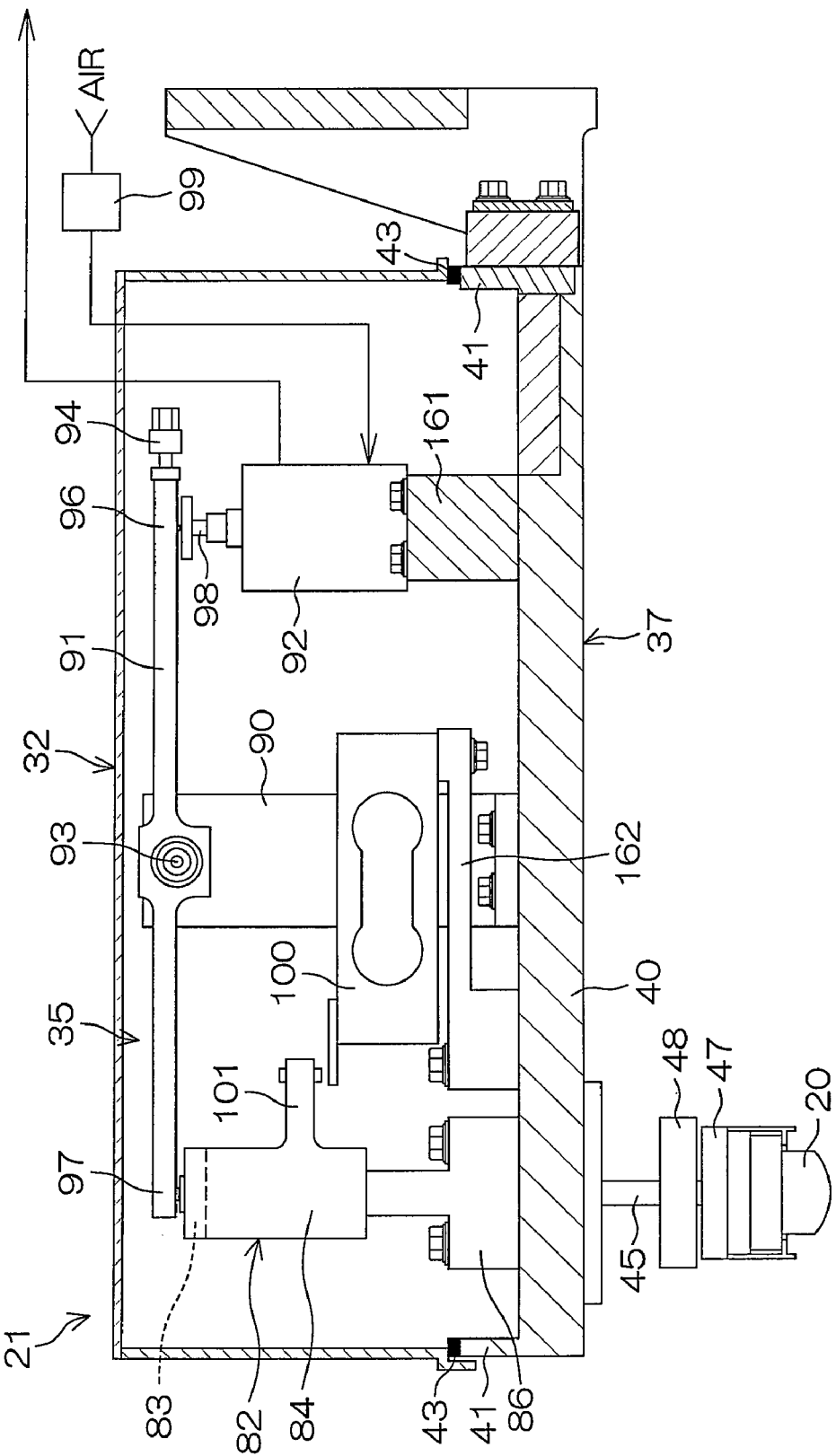
FIG. 11 is a longitudinal section view of the holding arm taken along the line XI-XI in FIG. 6.

FIG. 11 is a longitudinal section view of the holding arm 21 taken along the line XI-XI in FIG. 6. In the following, the load applying mechanism 35 will be discussed referring to FIGS. 6 and 11.

The load applying mechanism 35 has a seesaw member 91 swingably supported by a support member 90 and the pushing actuator 92 for applying, to the brush 20, a pushing force for pushing the same to the substrate W. For example an air cylinder, an electromagnetic plunger, a voice coil motor or the like may be used as the pushing actuator 92. The following description will discuss a case where an air cylinder is used as the pushing actuator 92.

As shown in FIG. 11, the support member 90 extends vertically and has a lower end fixed to the lower housing portion 37. A horizontally extending fulcrum shaft 93 is disposed at the upper end of the support member 90. The seesaw member 91 is connected to this fulcrum shaft 93. The seesaw member 91 is so supported by the support member 90 as to be swingable along a vertical plane with the fulcrum shaft 93 serving as a fulcrum.

The seesaw member 91 is for example a plate-like member substantially horizontal at a free state (where no load is being applied to the seesaw member 91). More specifically, a weight 94 is attached to the seesaw member 91 at its end (right end in FIGS. 6 and 11), and the seesaw member 91 is so adjusted by this weight 94 as to be substantially horizontal at the free state above-mentioned. As shown in FIG. 6, a plurality of through-holes 95 serving as weight reducing portions are formed in the seesaw member 91 side by side in the longitudinal direction thereof. These through-holes 95 cause the seesaw member 91 to be reduced in weight. This not only achieves weight saving of the substrate processing apparatus 1, but also improves the following properties while the driving force applied by the pushing actuator is transmitted to the brush.

Further, the seesaw member 91 has a force point section 96 at one side (the right side in FIGS. 6 and 11) with respect to the fulcrum (fulcrum shaft 93), and an actuating point section 97 at the other side (the left side in FIGS. 6 and 11) with respect to the fulcrum. In this embodiment, provision is made such that the distance between the force point section 96 and the fulcrum (fulcrum shaft 93) is substantially equal to the distance between the actuating point section 97 and the fulcrum. Accordingly, force entered to the force point section 96 is substantially equal to force supplied from the actuating point section 97. As shown in FIG. 6, the pushing actuator 92 is disposed under the force point section 96, and the horizontal plate 83 of the bracket 82 is disposed under the actuating point section 97.

As shown in FIG. 11, the pushing actuator 92 is fixed, with a rod 98 turned up, to the lower housing portion 37 through a pedestal 161. The rod 98 is vertically movable. The rod 98 disposed below the force point section 96 can push up the same from beneath. More specifically, the pushing actuator 92 is arranged to exert a driving force to the force point section 96 from beneath.

When the pushing actuator 92 exerts a driving force to the force point section 96, the seesaw member 91 swings along a vertical plane with the fulcrum shaft 93 serving as a fulcrum. When the seesaw member 91 swings, the actuating point section 97 thereof comes in contact with the top face of the horizontal plate 83 of the bracket 82 to downwardly push the same. Thus, the driving force from the pushing actuator 92 is transmitted to the bracket 82.

The driving force transmitted from the pushing actuator 92 to the bracket 82 is then transmitted, through the bracket 82 and the rotary shaft 45, to the brush 20 as "a pushing force for pushing the brush 20 to a substrate". More specifically, the bracket 82 and the rotary shaft 45 serve as a transmission member for transmitting the pushing force.

When the pushing actuator 92 gives a driving force to the seesaw member 91 with the cleaning face (underside) of the brush 20 being in contact with or in the vicinity of the top face of the substrate W held by the spin chuck 18, the seesaw member 91 swings to slightly downwardly move the bracket 82, the rotary shaft 45, the brush 20 and the like, such that the brush 20 is pushed onto the top face of the substrate W. When the brush 20 is moved along the top face of the substrate W while the brush 20 is being pushed thereto, foreign matter attached onto the top face of the substrate W is scrubbed therefrom. Thus, the foreign matter is removed from the substrate W.

The pushing pressure of the brush 20 to a substrate W is adjusted by the pressure of air supplied to the pushing actuator 92. More specifically, the pushing actuator 92 has an air intake port (not shown) and an exhaust port (not shown), and air from an air supply source is supplied to the air intake port through an air pressure adjusting valve 99 (See FIG. 11). As the air pressure adjusting valve 99, there is for example used an electropneumatic regulator capable of electrically adjusting the air pressure. The opening degree of the air pressure adjusting valve 99 is controlled by the main control unit 17 (See FIG. 3).

By supplying air to the pushing actuator 92 through the air intake port, the rod 98 can be vertically upwardly moved. This enables the force point section 96 to be pushed up, enabling the seesaw member 91 to be swung. Further, by adjusting the opening degree of the air pressure adjusting valve 99 to increase the air pressure to be exerted to the pushing actuator 92, the driving force exerted to the seesaw member 91 from the pushing actuator 92 can be increased. This enables the pushing pressure of the brush 20 to a substrate W to be increased.

The pushing pressure of the brush 20 to a substrate W is previously set based on a detected value of a pressure sensor 100 shown in FIGS. 6 and 11. More specifically, the air pressure to be exerted to the pushing actuator 92 can be previously set based on a detected value of the pressure sensor 100. As the pressure sensor 100, a pressure sensor of the distortion type can be for example used.

In the following, the pressure sensor 100 will be discussed referring to FIGS. 6 and 11.

As shown in FIG. 6, the pressure sensor 100 is disposed at the front side of the support member 90 and is fixed to the lower housing portion 37 through a pedestal 162. The pressure sensor 100 is disposed at a side of the bracket 82. As shown in FIG. 11, an extension portion 101 extending from the vertical plate 84 of the bracket 82 is disposed on the pressure sensor 100 at its left end above. The pressure sensor 100 and the extension portion 101 are separated from each other by a predetermined distance in a vertical direction with no driving force exerted to the bracket 82 from the seesaw member 91.

When air is supplied at a predetermined air pressure to the pushing actuator 92, a driving force corresponding to this air pressure is given from the pushing actuator 92 to the force point section 96 of the seesaw member 91. Thus, the seesaw member 91 is swung to downwardly push the bracket 82.

When the seesaw member 91 downwardly pushes the bracket 82, the extension portion 101 is downwardly moved to come in contact with the upper end of the pressure sensor 100, thus pushing the same. This produces a pushing pressure of the extension portion 101 to be applied to the pressure sensor 100, and this pushing pressure is detected by the pressure sensor 100. The detected value of the pressure sensor 100 is entered into the main control unit 17 (See FIG. 3).

The pushing pressure of the extension portion 101 applied to the pressure sensor 100 is detected in a state that the brush 20 does not come in contact with the substrate W (e.g., that the brush 20 is in a waiting position). More specifically, without the brush 20 coming in contact with the substrate W, the pushing actuator 92 is operated and the pushing pressure thus detected by the pressure sensor 100 is monitored. The air pressure supplied to the pushing actuator 92 is controlled such that the pushing pressure thus detected becomes the desired value. When the desired pushing pressure is obtained, there are stored, into a memory of the main control unit 17, control data corresponding to the air pressure at that time (more specifically, the control data of the air pressure adjusting valve 99).

When processing a substrate W, the control data stored in the memory are read out and the air pressure adjusting valve 99 is controlled with the use of the control data thus read. This operates the pushing actuator 92, causing the brush 20 to be pushed to the substrate W at the desired pushing pressure above-mentioned.

The positional relationship between the pressure sensor 100 and the extension portion 101 is set such that they do not come in contact with each other with the brush 20 being in contact with the substrate W. More specifically, the vertical distance between the pressure sensor 100 and the extension portion 101 without a driving force exerted to the bracket 82 from the seesaw member 91, is larger than the distance that the brush 20 is vertically moved as pushed by the load applying mechanism 35 when the brush 20 is pushed to the substrate W.

Accordingly, when the brush 20 is pushed to the substrate W, the extension portion 101 does not come in contact with the pressure sensor 100, thus producing no pushing pressure of the extension portion 101 to be applied to the pressure sensor 100. On the other hand, since while the brush 20 is being in the waiting position, the brush 20 can be vertically moved by a long distance, the extension portion 101 can come in contact with the pressure sensor 100. This produces the pushing pressure of the extension portion 101 to be applied to the pressure sensor 100.

When provision is made such that the extension portion 101 and the pressure sensor 100 do not come in contact with each other at the time when the brush 20 is pushed to the substrate W, all the driving force given from the seesaw member 91 to the bracket 82 can be transmitted to the brush 20. This enables the brush 20 to be securely pushed to the substrate W at the desired pushing pressure.

While the substrate W is being processed with the brush 20 pushed thereto, the pressure sensor 100 is generally in a state that no load is detected. However, if there is something abnormal, for example a rupture of the substrate W, the vertical moving distance of the brush 20 is increased. Then, when the pressure sensor 100 detects a load, this is detected as an error.

As mentioned earlier, the rotary shaft 45, the brush 20 and the like are resiliently supported by the coil spring 49, and the own weights of the rotary shaft 45, the brush 20 and the like are offset by the elastic reaction force of the coil spring 49. Accordingly, force having a designed magnitude can be given to the brush 20 with no influence exerted by these own weights. Accordingly, the pushing pressure of the brush 20 to a substrate W can be controlled with high precision.

According to one of the characteristics of the present embodiment, the provision of the seesaw member 91 enhances the degree of freedom for arranging the pushing actuator 92. More specifically, as far as provision is made such that the pushing force of the brush 20 to a substrate W is given to the force point section 96 of the seesaw member 91 from the pushing actuator 92, the pushing actuator 92 may be disposed above, under or at a side of the seesaw member 91.

When the pushing actuator 92 is disposed under the seesaw member 91 as done in the present embodiment, the vertical height of the housing 32 can be reduced most effectively. According to such an arrangement, the vertical height of the holding arm 21 can be reduced, resulting in reduction in the height of the processing units 10. This advantageously reduces the substrate processing apparatus 1 in height.

Further, the first linear guide mechanism 79 and the motor 150 serving as a rotation actuator, are disposed at a side of the rotary shaft 45, and the heights of this first linear guide mechanism 79 and the motor 150 are made lower than the height of the rotary shaft 45. This further reduces the vertical height of the housing 32. More specifically, according to the present embodiment, the pushing actuator 92, the first linear guide mechanism 79 and the motor 150 are disposed at proper positions, thus enabling the space inside of the housing 32 to be efficiently utilized. This reduces the vertical height of the housing 32, thus advantageously reducing the substrate processing apparatus 1 in height.

Figure 12:
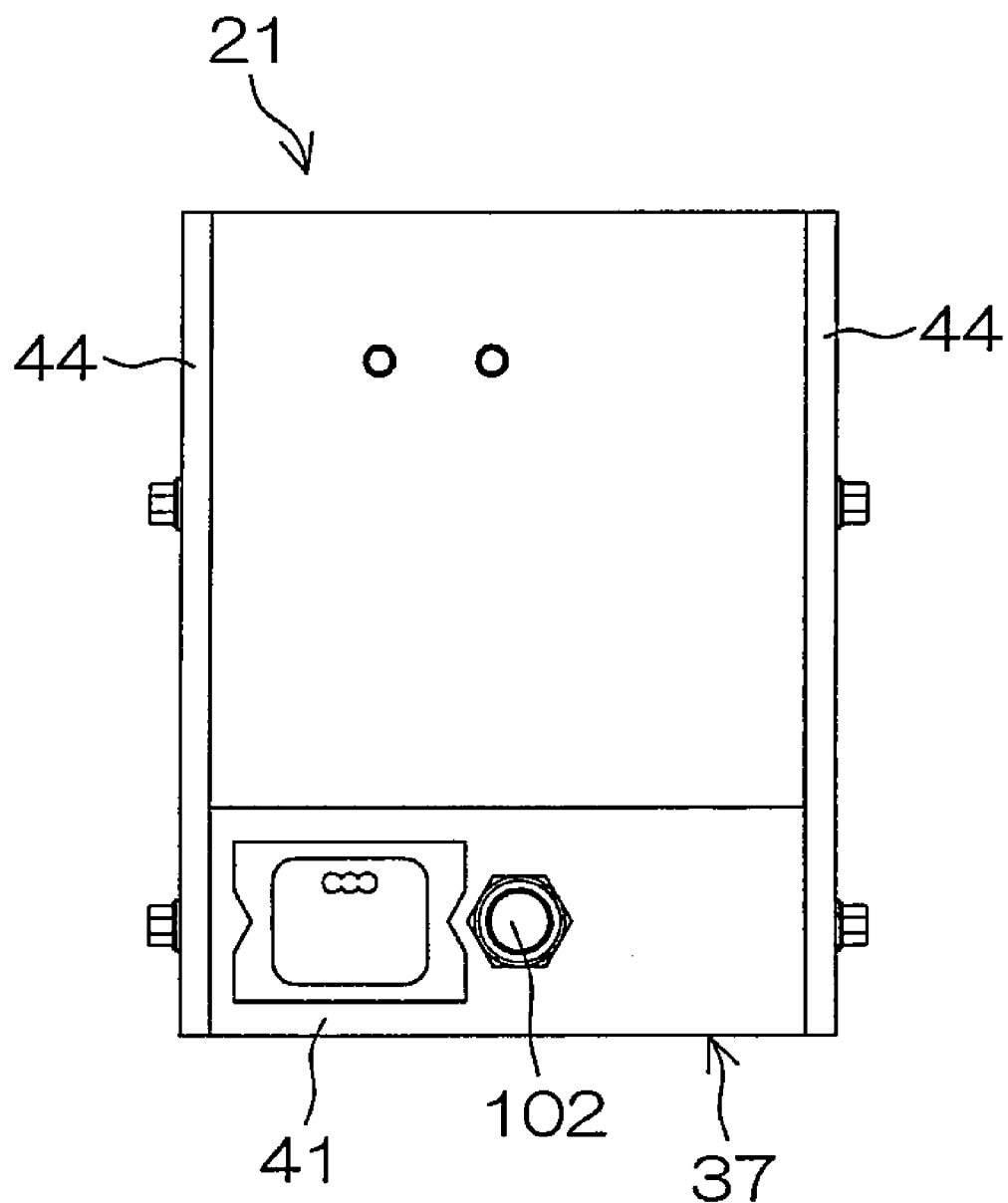
FIG. 12 is a schematic side view of the holding arm taken from the direction XII in FIG. 6.

FIG. 12 is a schematic side view of the holding arm 21 viewed from the direction XII in FIG. 6. The following will discuss an exhaust port 102 for exhausting the atmosphere in the housing 32 referring to FIGS. 11 and 12.

The lower housing portion 37 is provided in the peripheral wall 41 thereof with the exhaust port 102. This exhaust port 102 is connected, through an exhaust duct, to an exhaust source (not shown) disposed outside of the processing chamber. Provision is made such that the atmosphere in the housing 32 is exhausted by this exhaust source. More specifically, the atmosphere in the housing 32 is guided to the outside of the processing chamber through the exhaust port 102 and the exhaust duct.

By exhausting the atmosphere in the housing 32 by the exhaust source, it is possible not only to remove, from the housing 32, dust generated therein (e.g., wear powder generated by wear of the belt 75 and the bearings 140 to 143) together with the atmosphere, but also to discharge such dust to the outside of the processing chamber. This restrains or prevents the dust generated inside of the housing 32 from sticking to the substrate W, causing the same to be contaminated.

The pressure inside of the housing 32 is maintained substantially constant since the atmosphere in the processing chamber is supplied to the housing 32 through the sponge-like packing 43 when the atmosphere in the housing 32 is exhausted by the exhaust source. The packing 43 permits only gas to pass therethrough. This restrains or prevents the atmosphere in the processing chamber containing a treating liquid from entering the housing 32 through the packing 43. This restrains or prevents the component elements in the housing 32 from being damaged by the treating liquid contained in the atmosphere.

According to the present embodiment, even though the atmosphere in the processing chamber containing the treating liquid, enters inside of the housing 32 through the packing 43, there is no possibility of the component elements of the housing 32 being damaged by a liquid component contained in the atmosphere of the processing chamber because deionized water is used as the treating liquid and consequently this liquid component is mainly composed of water.

Figure 13:
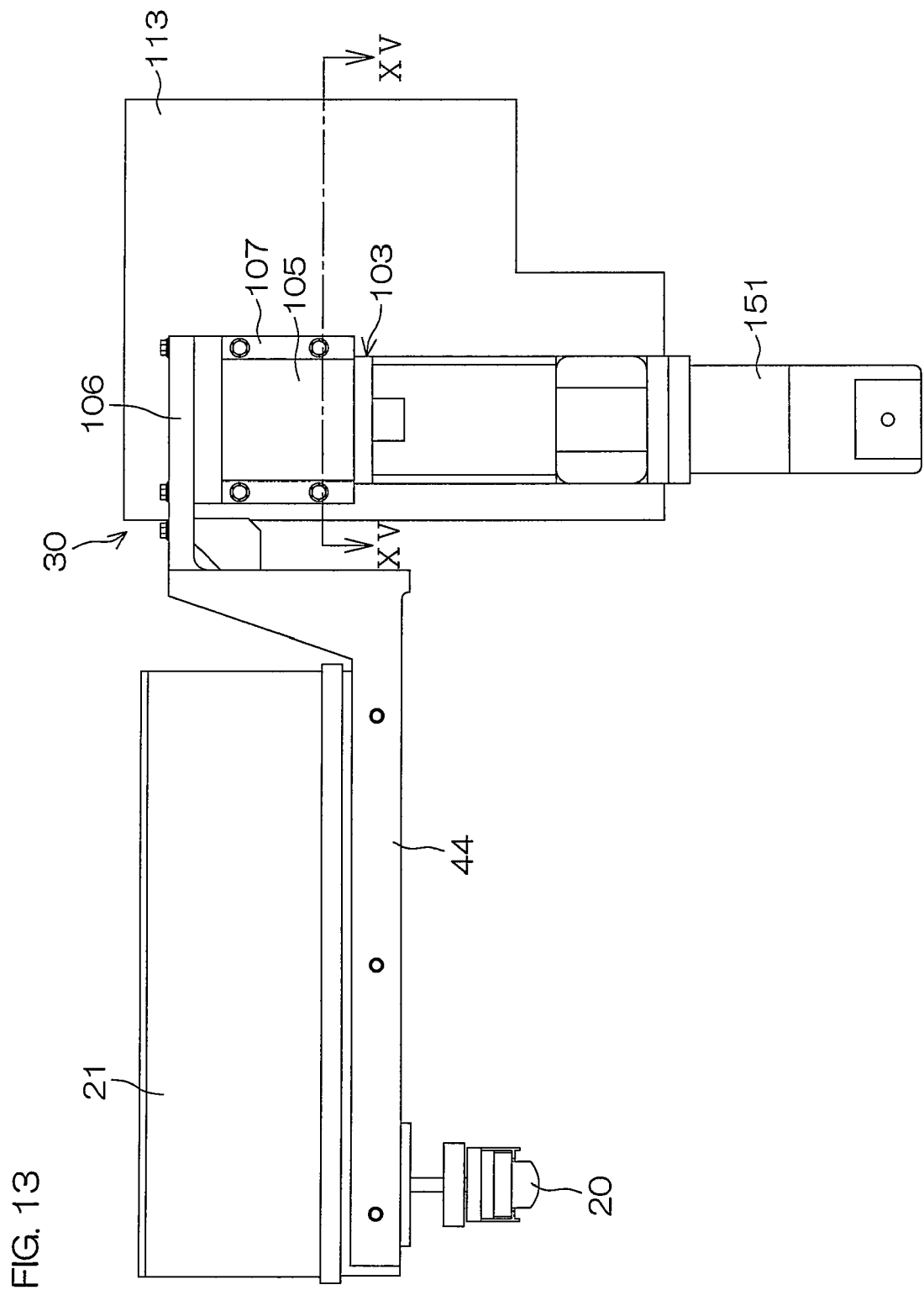
FIG. 13 is a schematic front view of the arrangement of a Z-axis moving mechanism.
Figure 14:
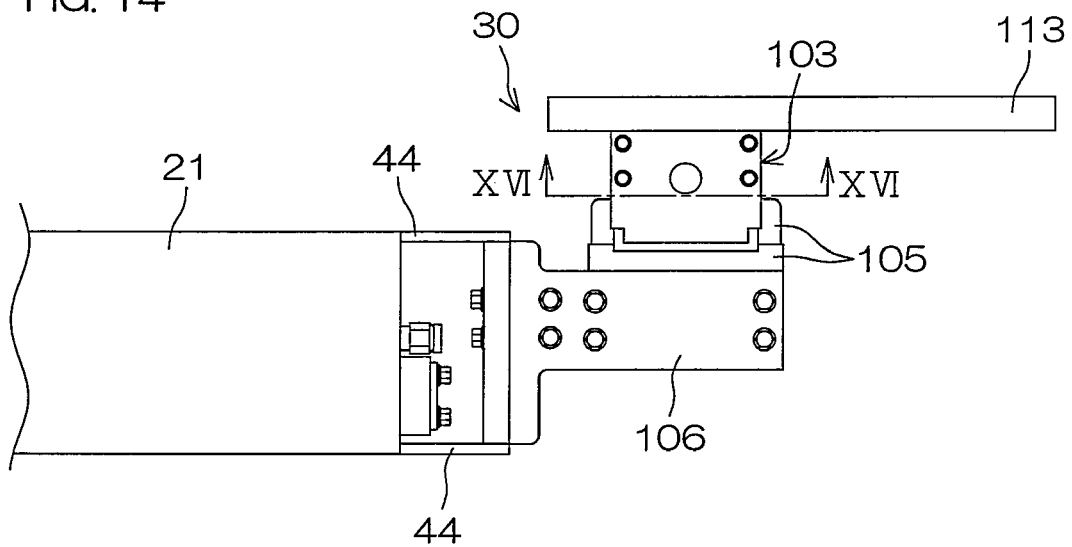
FIG. 14 is a schematic plan view of the arrangement of the Z-axis moving mechanism.

FIG. 13 is a schematic front view of the Z-axis moving mechanism 30, while FIG. 14 is a schematic plan view thereof.

The Z-axis moving mechanism 30 has a ball screw mechanism 103, a motor 151 for giving a driving force thereto, and a vertically moving member 105 connected to the ball screw mechanism 103.

The holding arm 21 is connected to the vertically moving member 105 through the pair of lateral plates 44 mentioned earlier, a first bracket 106 and a second bracket 107. The holding arm 21 is vertically moved together with the vertically moving member 105. Provision is made such that the motor 151 is controlled by the main control unit 17.

Figure 15:
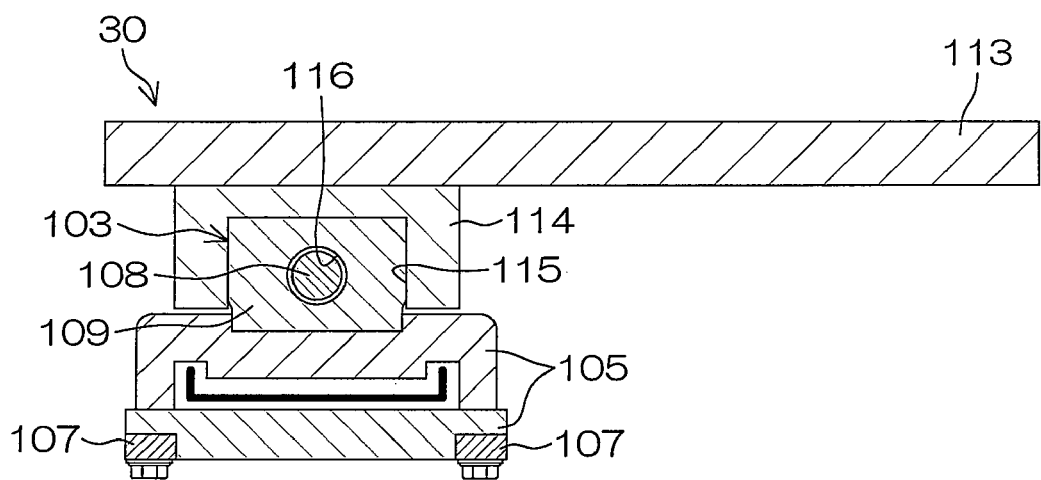
FIG. 15 is a cross section view of the Z-axis moving mechanism taken along the line XV-XV in FIG. 13.
Figure 16:
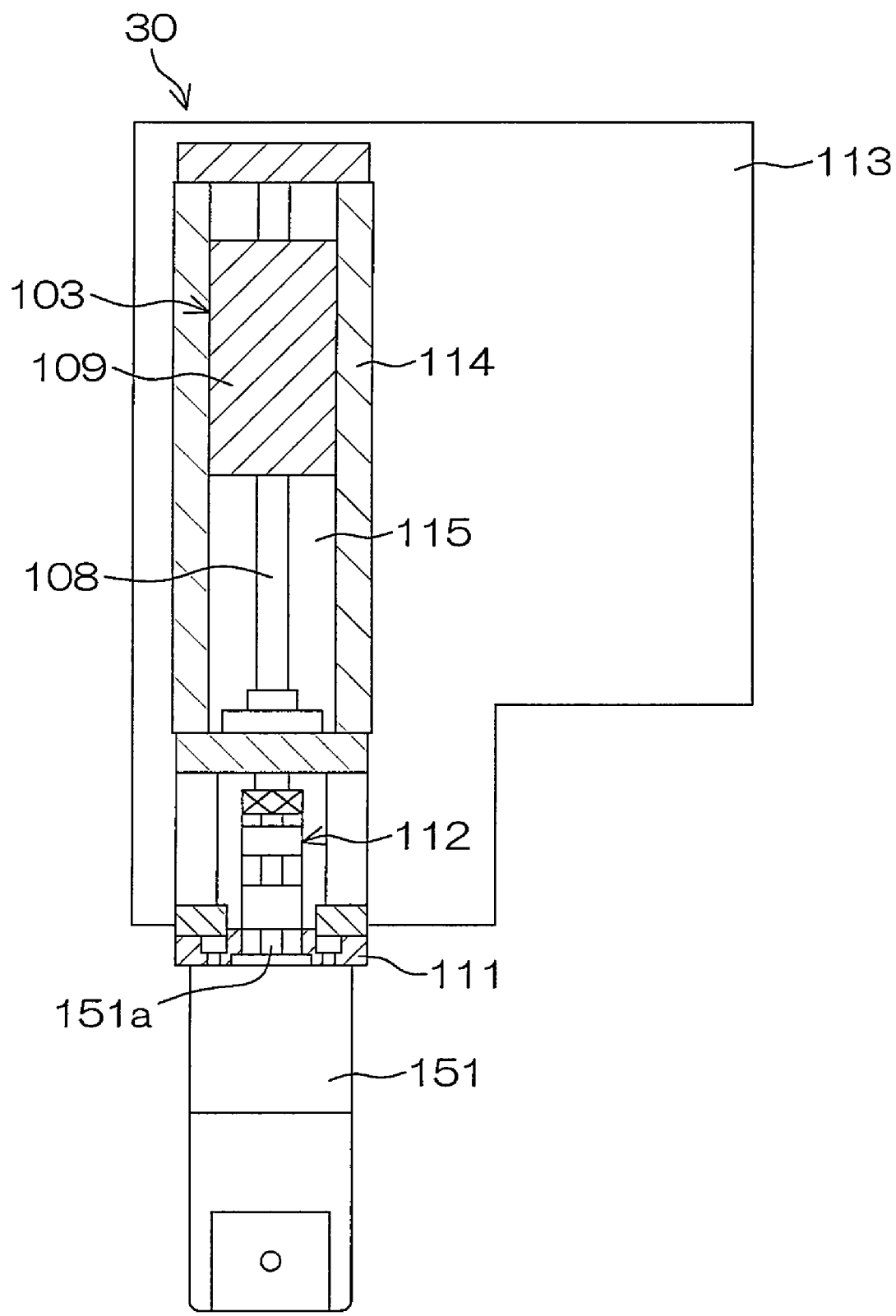
FIG. 16 is a longitudinal section view of the Z-axis moving mechanism taken along the line XVI-XVI in FIG. 14.

FIG. 15 is a cross section view of the Z-axis moving mechanism 30 taken along the line XV-XV in FIG. 13, while FIG. 16 is a longitudinal section view of the Z-axis moving mechanism 30 taken along the line XVI-XVI in FIG. 14.

The ball screw mechanism 103 includes a vertically extending ball screw 108 and a ball nut 109 threadedly connected thereto through a plurality of balls (not shown). As shown in FIG. 16, the motor 151 is held under the ball screw 108 by a holding bracket 111 with an output shaft 151a of the motor 151 turned up. The output shaft 151a of the motor 151 is connected to the lower end of the ball screw 108 through a joint 112. The rotation of the output shaft 151a is transmitted to the ball screw 108 through the joint 112.

As shown in FIG. 16, the holding bracket 111 which holds the motor 151, is fixed to a flat-plate-like first base member 113 disposed in a horizontal direction. As shown in FIG. 15, the ball nut 109 is fixed to the first base member 113 through a guide member 114 for guiding the movement of the ball nut 109.

The guide member 114 extends vertically along the first base member 113 and has a vertically extending guide groove 115. The ball nut 109 is fitted in this guide groove 115 and is vertically guided therealong.

The ball nut 109 is in the form of square pole and is provided in the center thereof with a vertically extending threaded hole 116. The ball screw 108 is threadedly fitted in the threaded hole 116 through a plurality of balls. As shown in FIG. 15, the vertically moving member 105 is fixed to one end (the lower end in FIG. 15) of the ball nut 109. The vertically moving member 105 is vertically movable together with the ball nut 109.

When the output shaft 151a of the motor 151 is rotated, this rotation is transmitted to the ball screw 108 and the ball nut 109 is vertically moved along the guide member 114. This vertically moves the vertically moving member 105, the first and second brackets 106, 107, the pair of lateral plates 44 and the holding arm 21. Thus, the holding arm 21 and the brush 20 are vertically (in the z-axis direction) moved.

Figure 17:
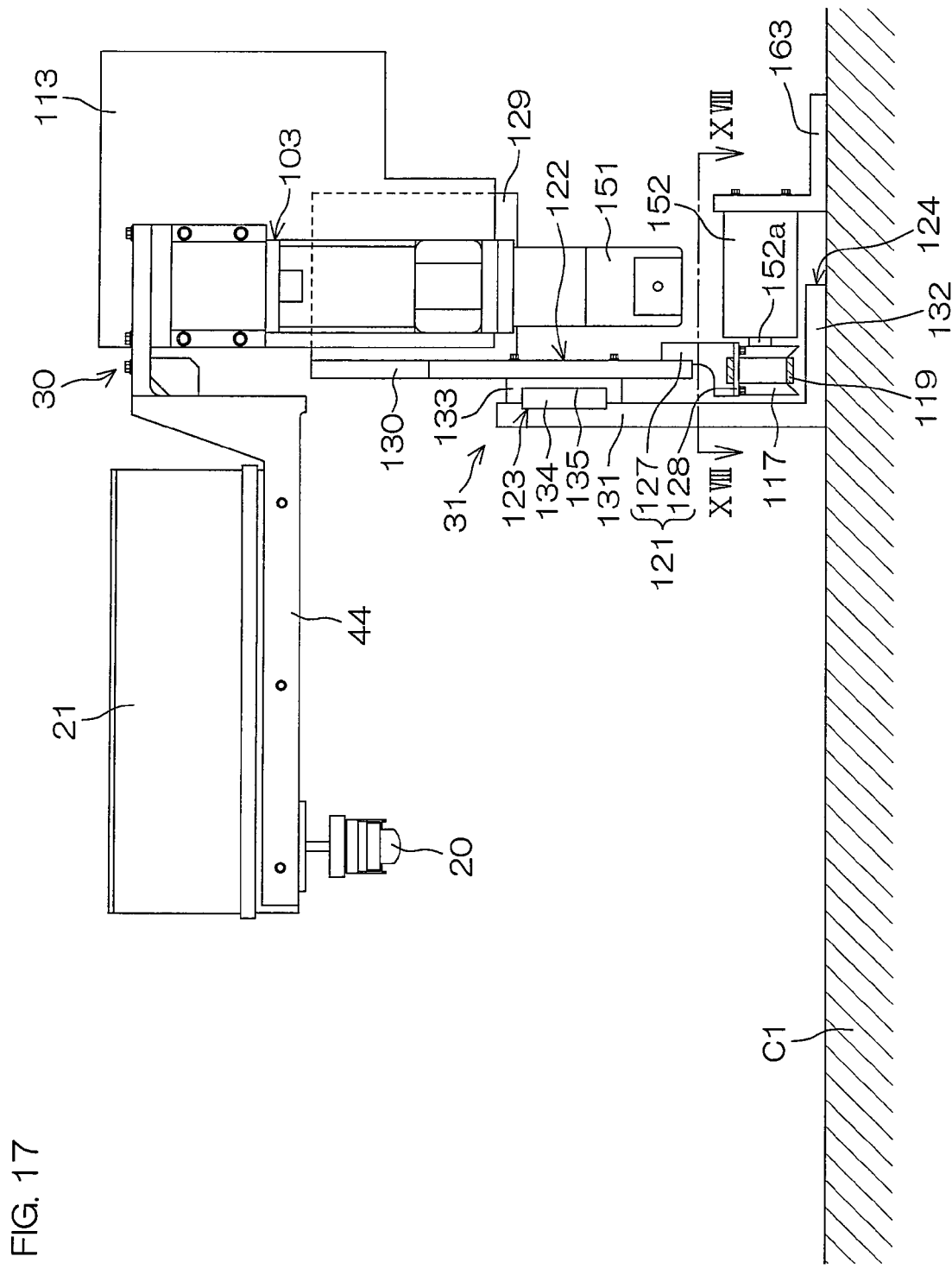
FIG. 17 is a schematic front view of the arrangement of a Y-axis moving mechanism.
Figure 18:
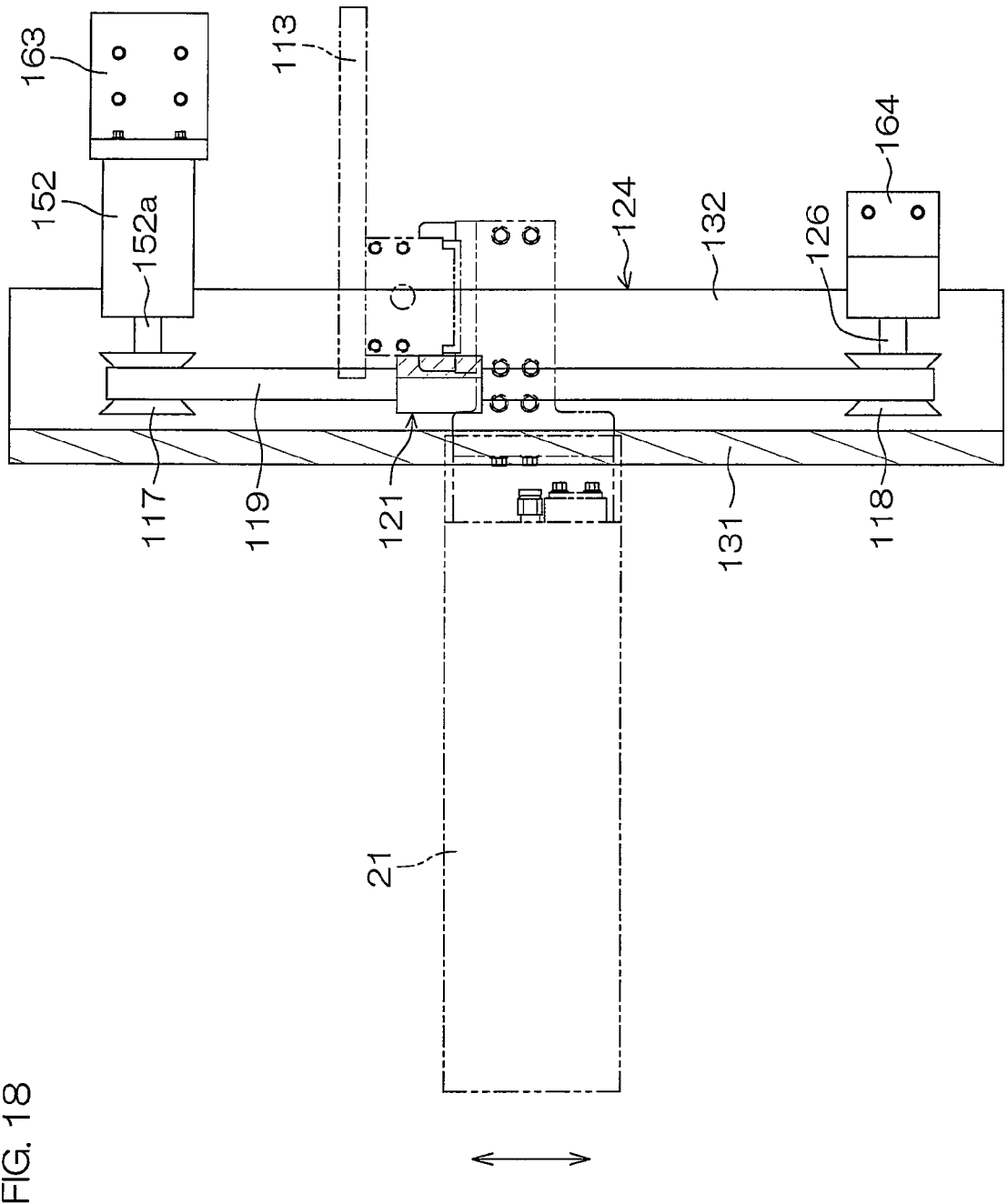
FIG. 18 is a cross section view of the Y-axis moving mechanism taken along the line XVIII-XVIII in FIG. 17.

FIG. 17 is a schematic front view of the arrangement of the Y-axis moving mechanism 31, while FIG. 18 is a cross section view thereof taken along the line XVIII-XVIII in FIG. 17.

The Y-axis moving mechanism 31 has: first and second pulleys 117, 118 which are separated from each other by a predetermined distance in a horizontal direction (Y-axis direction); a belt 119 installed between the first and second pulleys 117, 118; a motor 152 connected to the first pulley 117; a second base member 122 connected to the belt 119 through a clamp member 121; and an L-shape bracket 124 which horizontally movably supports the second base member 122 through a second linear guide mechanism 123.

The motor 152, disposed such that its output shaft 152a is substantially horizontal, is fixed to a processing chamber C1 through a pedestal 163. The first pulley 117 is coaxially connected to the output shaft 152a and is to be rotationally driven by the motor 152. The motor 152 is controlled by the main control unit 17. As shown in FIG. 18, the second pulley 118 is rotatably supported by a pedestal 164 through a spindle 126. The pedestal 164 is fixed to the processing chamber C1.

When the first pulley 117 is rotationally driven by the motor 152, the rotation of the first pulley 117 is transmitted to the second pulley 118 through the belt 119. This horizontally moves the clamp member 121. More specifically, the clamp member 121 which is fixed to the belt 119, is arranged to be horizontally moved with the rotation thereof.

As shown in FIG. 17, the clamp member 121 includes a first clamp piece 127 and a second clamp piece 128 which are fixed to each other. The belt 119 is held by and between the first and second clamp pieces 127, 128. Thus, the clamp member 121 is fixed to the belt 119. The first clamp piece 127 is fixed to the second base member 122. Accordingly, when the clamp member 121 is horizontally moved with the rotation of the belt 119, the second base member 122 is also horizontally moved.

As shown in FIG. 17, the second base member 122 includes a flat-plate stationary portion 129 fixed to the first base member 113, and a flat-plate orthogonal portion 130 at a right angle to the stationary portion 129. The stationary portion 129 is disposed at the back-face side of the first base member 113 (at the side where the ball screw mechanism 103 and the like are not being disposed). The stationary portion 129 is fixed to the first base member 113 from this back-face side thereof. The orthogonal portion 130 is connected to the L-shape bracket 124 through a second linear guide 134. The L-shape bracket 124 includes a vertical portion 131 which extends both in horizontal and vertical directions, and a horizontal portion 132 which extends horizontally from the lower end of the vertical portion 131.

The second linear guide mechanism 123 has a second slide member 133 fixed to the orthogonal portion 130, and a second linear guide 134 forming a pair together with the second slide member 133. The second linear guide 134 is a flat-plate member and extends in a horizontal direction. The second linear guide 134 is fixed to a vertical portion 131 of the L-shape bracket 124.

The second slide member 133 has a horizontally extending second slide groove 135. With the second linear guide 134 fitted in the second slide groove 135, the second slide member 133 is held by the second linear guide 134. The second slide member 133 is horizontally slidable with respect to the second linear guide 134. The second linear guide 134 guides the horizontal movement of the second slide member 133. Accordingly, the second base member 122 fixed to the second slide member 133 is also horizontally guided by the second linear guide 134. When the second base member 122 is horizontally moved, the first base member 113 fixed thereto is also horizontally moved.

More specifically, when the first pulley 117 is rotationally driven by the motor 152, the belt 119 is rotated to move the clamp member 121 in a horizontal direction. This horizontally moves the first and second base members 113, 122 to horizontally move the holding arm 21. Thus, the holding arm 21 and the brush 20 are moved in a horizontal direction (Y-axis direction).

An embodiment of the present invention has been thus discussed, but the present invention should not be limited to this specific embodiment and various modifications can be made within the scope of the appended claims. For example, the description has been made of the case where all processing units 10 are back-side cleaning processing units. However, the processing units 10 may contain a surface cleaning processing unit for scrubbing-cleaning the surface of a substrate W, or all the processing units 10 may be surface cleaning processing units.

Further, when a processing unit 10 is a surface cleaning processing unit, there may be used not only the spin chuck 18 having the arrangement mentioned earlier for holding a substrate W with the end face thereof held, but also, for example, a vacuum chuck of a vacuum-adsorbing type by which the back side of a substrate W is substantially horizontally vacuum-adsorbed and held and which is rotated, with this state maintained, around a substantially vertical axis, enabling the substrate W held to be rotated.

In the foregoing, the description has been made of an embodiment of the present invention in which the back side of a substrate W is scrubbed by the brush 20, but the present invention may be applied to an embodiment in which the peripheral end face of a substrate W is cleaned by the brush 20 (so-called bevel cleaning).

Figure 19:
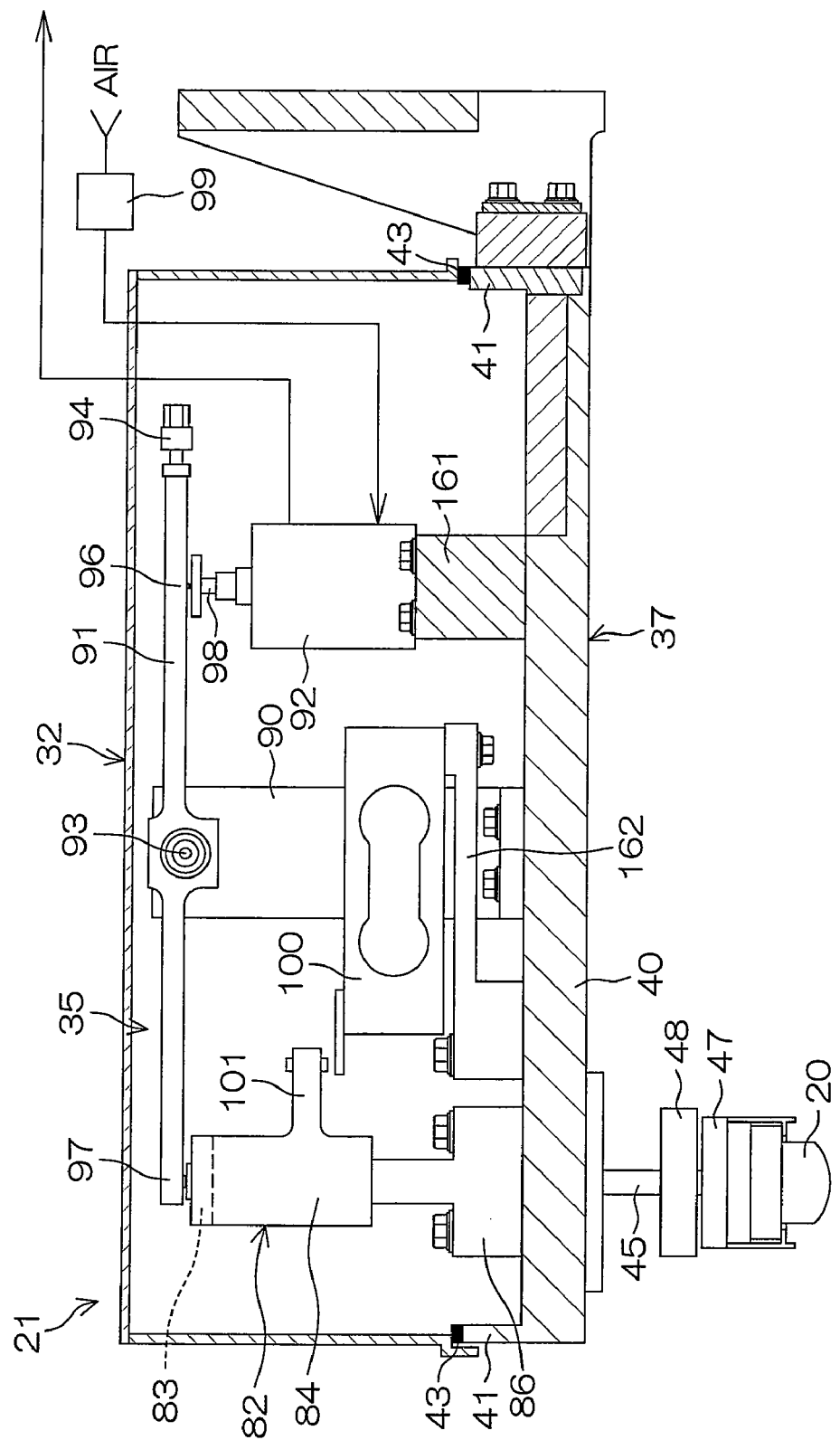
FIG. 19 is a section view illustrating the arrangement of a further embodiment of the present invention.

In the foregoing, the description has been made of an embodiment of the present invention in which the distance between the force point section 96 and the fulcrum (fulcrum shaft 93) is substantially equal to the distance between the actuating point section 97 and the fulcrum. As shown in FIG. 19, however, the distance between the force point section 96 and the fulcrum (fulcrum shaft 93) may be shorter than the distance between the actuating point section 97 and the fulcrum. In this case, the pushing pressure of the brush 20 applied to a substrate W can be readily controlled with high precision. More specifically, even though the driving force given from the pushing actuator 92 to the force point section 96 varies, the variation of the force given from the actuating point section 97 to the bracket 82 is smaller than the variation of the driving force given to the force point section 96 because the distance between the force point section 96 and the fulcrum is shorter than the distance between the actuating point section 97 and the fulcrum. Accordingly, even though the driving force given from the pushing actuator 92 to the seesaw member 91 is not controlled with high precision, the force given from the actuating point section 97 to the transmission member can be kept substantially constant. Thus, the pushing pressure of the brush 20 applied to a substrate W can be readily controlled with high precision.

Figure 20:
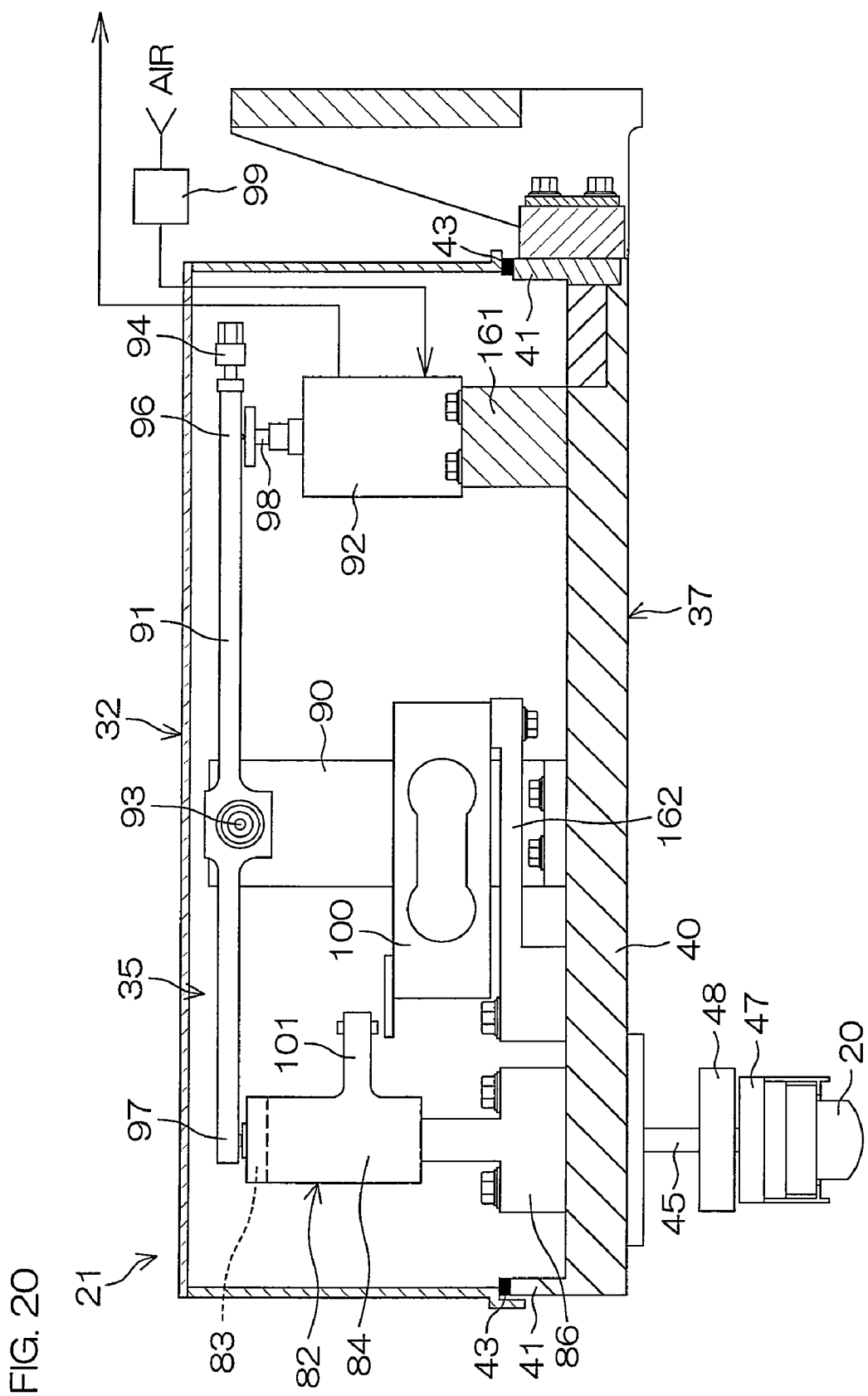
FIG. 20 is a section view illustrating the arrangement of another embodiment of the present invention.

Alternatively, as shown in FIG. 20, the distance between the force point section 96 and the fulcrum (fulcrum shaft 93) maybe longer than the distance between the actuating point section 97 and the fulcrum (fulcrum shaft 93). In this case, the driving force given to the force point section 96 is transmitted, as amplified, to the actuating point section 97. Thus, there may be used, as the pushing actuator 92, an actuator of which driving force is small. Accordingly, the pushing actuator may be miniaturized, resulting in further reduction in the height of the processing units 10.

Embodiments of the present invention have been discussed in detail, but these embodiments are mere specific examples for clarifying the technical contents of the present invention. Therefore, the present invention should not be construed as limited to these specific examples. The spirit and scope of the present invention are limited only by the appended claims.

This application corresponds to Japanese Patent Application No. 2008-44327 filed on Feb. 26, 2008 with Japanese Patent Office, the disclosure of which is incorporated herein by reference.

What we claim is:

1. A substrate processing apparatus, comprising:
   a brush for cleaning a substrate;
   a seesaw member which is swingable with a support member serving as a fulcrum, the seesaw member having a force point section at one side with respect to the fulcrum and an actuating point section at other side with respect to the fulcrum;
   a pushing actuator arranged to give a driving force to the force point section of the seesaw member, thereby to swing the seesaw member around the fulcrum, thus giving, to the seesaw member, a pushing force for pushing the brush to a substrate; and
   a transmission member which has an affected point section for receiving, from the actuating point section of the seesaw member, a driving force given to the force point section, the transmission member transmitting, to the brush, a pushing force for pushing the brush to the substrate, wherein
   the seesaw member is supported by the support member such that the seesaw member is swingable along a vertical plane;
   the pushing actuator is disposed to give a driving force to the force point section of the seesaw member from under the force point section; and
   the transmission member includes a shaft which extends down to a position under the actuating point section of the seesaw member, a lower end of the shaft being connected to the brush.

2. A substrate processing apparatus according to claim 1, further comprising a guide mechanism disposed at a side of the shaft for guiding the shaft in an axial direction of the shaft.

3. A substrate processing apparatus according to claim 1 further comprising a rotation actuator disposed at a side of the shaft for integrally rotating the shaft and the brush.

4. A substrate processing apparatus according to claim 1, wherein the seesaw member has a void.

5. A substrate processing apparatus according to claim 1, wherein a distance between the force point section and the fulcrum is different from a distance between the actuating point section and the fulcrum.

6. A substrate processing apparatus according to claim 1, wherein the pushing actuator is disposed under the seesaw member.

7. A substrate processing apparatus according to claim 1, wherein the pushing actuator is disposed under the force point section.

8. A substrate processing apparatus, comprising:
   a brush for cleaning a substrate;
   a seesaw member which is swingable with a support member serving as a fulcrum, the seesaw member having a force point section at one side with respect to the fulcrum and an actuating point section at other side with respect to the fulcrum;
   a pushing actuator arranged to give a driving force to the force point section of the seesaw member, thereby to swing the seesaw member around the fulcrum, thus giving, to the seesaw member, a pushing force for pushing the brush to a substrate; and
   a transmission member which has an affected point section for receiving, from the actuating point section of the seesaw member, a driving force given to the force point section, the transmission member transmitting, to the brush, a pushing force for pushing the brush to the substrate; and
   further comprising a rotation actuator disposed at a side of the shaft for integrally rotating the shaft and the brush.

* * * * *